United States Patent [19]
Satoshi

[11] Patent Number: 5,944,775
[45] Date of Patent: Aug. 31, 1999

[54] SUM-OF-PRODUCTS ARITHMETIC UNIT

[75] Inventor: Matsui Satoshi, Kawasaki, Japan

[73] Assignee: Fujitsu Limited, Kawasaki, Japan

[21] Appl. No.: 08/904,441

[22] Filed: Jul. 31, 1997

Related U.S. Application Data

[63] Continuation of application No. 08/403,657, Mar. 14, 1995, abandoned.

[30] Foreign Application Priority Data

Mar. 16, 1994 [JP] Japan ..................................... 6-044552

[51] Int. Cl.$^6$ ............................... G06F 7/00; G06F 15/00
[52] U.S. Cl. ......................... 708/603; 708/300; 708/552; 708/626; 711/214
[58] Field of Search ................................ 364/750.5, 758, 364/745, 748, 736, 736.5, 737, 759, 724.011, 745.03, 748.04

[56] References Cited

U.S. PATENT DOCUMENTS

| | | |
|---|---|---|
| 4,706,209 | 11/1987 | Picco ....................................... 364/745 |
| 4,945,507 | 7/1990 | Ishida et al. .............................. 364/737 |
| 5,315,699 | 5/1994 | Imai et al. ................................ 395/162 |
| 5,400,271 | 3/1995 | Himeno ................................. 364/750.5 |
| 5,420,809 | 5/1995 | Read et al. .......................... 364/715.01 |
| 5,426,753 | 6/1995 | Moon ....................................... 395/405 |
| 5,457,805 | 10/1995 | Nakamura ............................. 364/750.5 |

*Primary Examiner*—Emmanuel L. Moise
*Attorney, Agent, or Firm*—Armstrong, Westerman, Hattori, McLeland & Naughton

[57] ABSTRACT

A sum-of-products arithmetic unit includes a coefficient register, a data register, a multiplier, an adder, and a data bus used for the transfer of data to and from an external unit. Provision is made to allow addresses in the data register in which sum-of-products arithmetic data is to be stored to be specified without externally specifying an individual address in the data register for each piece of arithmetic data. This provision comprises an automatic data batch storage section, automatic address setting section, or address setting section.

21 Claims, 18 Drawing Sheets

SUM-OF-PRODUCTS ARITHMETIC UNIT

This application is a continuation application Ser. No. 08/403,657 filed Mar. 14, 1995, now abandoned.

BACKGROUND OF THE INVENTION

1. Field of the Invention

The present invention relates to a sum-of-products arithmetic unit. More specifically, the present invention relates to a sum-of-products arithmetic unit which functions as an IIR (Infinite Impulse Response) filter (recursive filter) or FIR (Finite Impulse Response) filter (non-recursive filter) and achieves a high transfer rate.

2. Description of the Related Art

In recent years, requirements of filtering data by the use of digital filters have been increasing in the fields of automobile, mechatronics, etc. Sum-of-product arithmetic units, DSPs (Digital Signal Processors) which are LSIs (Large-Scale Integrated Circuits) dedicated to digital signal processing, and so on have been put to practical use. In these fields, filtering computations are mainly used in which a small number of operation terms is involved, and IIR filters with high processing speeds are often used.

FIG. 1 shows an arrangement of a conventional sum-of-products arithmetic unit using FIR.

This arithmetic unit comprises two registers that can each be implemented by a random access memory (RAM), i.e., a coefficient register 800 and a data register 810, a multiplier 830 which multiplies outputs of registers 800 and 810 together, an adder 840 which takes the output of multiplier 830 as its input, an intermediate data register 850 which stores the intermediate result of the sum-of-products operation performed by multiplier 830 and adder 840, a result register 860 which stores the result of an arithmetic operation of sum-of-products, and an address decoder 870 which specifies addresses of data register 810. Adder 840 takes the output of intermediate data register 850 as its other input, thereby enabling a sum-of-products arithmetic operation.

In operation, first, coefficient data and input data are transferred to coefficient register 800 and data register 810, respectively, over a data bus 820. For example, for a sum of products for four terms, four pieces of input data and four pieces of coefficient data are entered into data register 810 and coefficient register 800, respectively. One input and one coefficient are multiplied in turn and the resulting products are then added, thereby performing FIR filtering computation. In writing data into data register 810, its addresses are specified by an external CPU not shown. That is, an address is loaded into address decoder 870 from the external CPU, then decoded by it to obtain a real address of the data register. A piece of input data is written into that address via data bus 820, and the input data is read from that address, then entered into multiplier 830, starting a sum-of-products operation.

In order to implement an IIR filter by this arithmetic unit, it is required to transfer the result of a sum-of-products operation stored in result register 860 to data register 810 over data bus 820 and start another sum-of-products operation again. That is, it is required for the external CPU to address data register 810 to write the contents of result register 860 into its real address obtained by address decoder 870, then specify a read address of the data register and start the next sum-of-products operation.

With the conventional method, however, the external CPU must direct data register addressing and the start of sum-of-products operations. Thus, software is needed for this control and the speed of processing such as data transfer becomes low.

In addition, since the CPU specifies write addresses in the data register, an address storage area in the CPU is needed for each piece of data.

SUMMARY OF THE INVENTION

The present invention relates to a sum-of products arithmetic operation unit.

An object of the present invention is to provide a sum-of-products arithmetic unit which permits register addresses in which operation data is stored to be generated automatically, the intermediate result of an operation to be output, overflow notification to be made, processing efficiency to be increased, and a recursive filter to be configured easily.

In a sum-of-products arithmetic unit of the present invention, which includes a coefficient data register, a data register, a multiplier, an adder, an intermediate data register, and a data bus used for transfer of data to and from an external unit such as a CPU, provision is made to allow storage locations in the data register for pieces of arithmetic data transferred from the external unit to be specified without the need for the external unit to address the data register for each piece of arithmetic data.

According to a first aspect of the invention, an automatic data batch storage section is provided for that purpose. Once the automatic data batch storage section receives address data from an external unit at the time of transfer of arithmetic data, it automatically specifies each of the storage locations in the data register in sequence with each transfer of arithmetic data.

According to a second aspect of the invention, an automatic address setting section is provided, which, at the time of transfer of arithmetic data, makes a decision as to whether or not an address from the external unit matches an address in the data register and, when the address match occurs, automatically specifies storage locations in the data register for arithmetic data. All of addresses sent from the external unit may be the same.

According to a third aspect of the invention, an address setting section is provided, which, when an address and pointer values are specified by the external unit at the time of transfer of arithmetic data, computes the sum of the address and each of the pointer values and thereby specifies the storage locations in the data register for arithmetic data.

The arithmetic unit of the invention may be arranged to automatically transfer the partially completed result of arithmetic to the data register as a piece of arithmetic data. This automatic transfer initiates the next arithmetic.

The arithmetic unit of the invention may be arranged to output the partially completed result of the arithmetic to the external unit.

The arithmetic unit may be provided with a register which, if overflow occurs while sum-of-products arithmetic is being performed, stores the number of a term when overflow occurred and a register which stores partially completed result of the arithmetic.

DETAILED DESCRIPTION OF THE PREFERRED EMBODIMENTS

Figure 1:
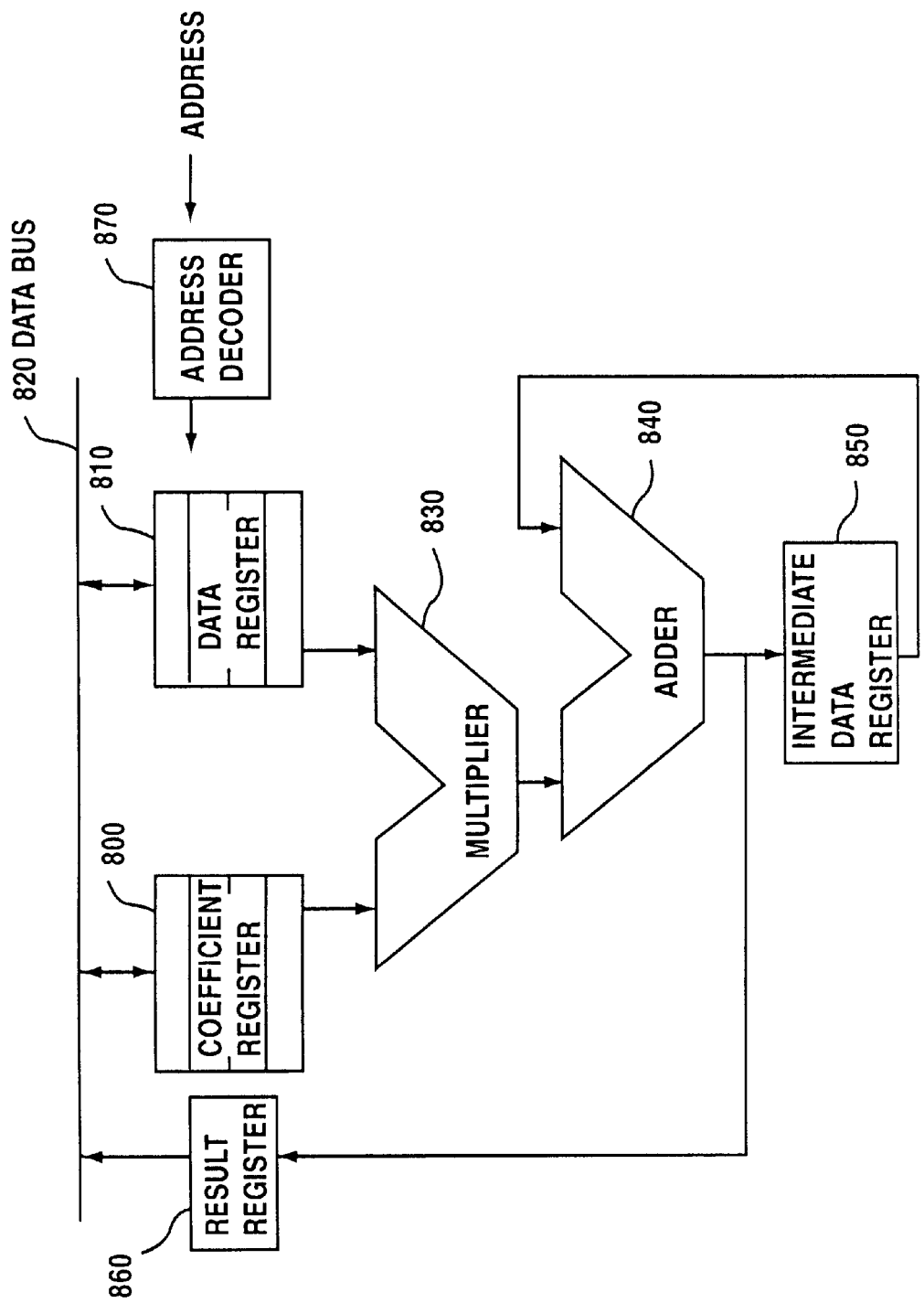
FIG. 1 shows an arrangement of a conventional sum-of-products arithmetic unit.

In FIGS. 2 through 7, there are illustrated, in block diagram form, sum-of-products arithmetic units embodying the present invention. The sum-of-products arithmetic units of the present invention comprise, in general, a coefficient register 100 for storing a plurality of coefficients for sum-of-products arithmetic, a data register 110 for storing a plurality of pieces of data for the sum of products, a data bus 120, a multiplier 130 and an adder 140 which provides a sum of products of coefficients stored in coefficient register 100 and data stored in data register 110, an intermediate data register 150 which stores intermediate data of the sum-of-products arithmetic, a result register 160 which stores the result of the sum-of-products arithmetic, and an address bus 170. Data bus 120 and address bus 170 are connected with a CPU not shown and used to transfer data and address information.

Coefficient register 100 is connected with data bus 120. The output of coefficient register 100 is connected to an input of multiplier 130, to the other input of which is connected the output of data register 110. The output of multiplier 130 is connected to an input of adder 140, to the other input of which is connected the output of intermediate data register 150. The output of adder 140 is connected to the inputs of intermediate data and result registers 150 and 160. The output of result register 160 is connected to data bus 120.

Figure 2:
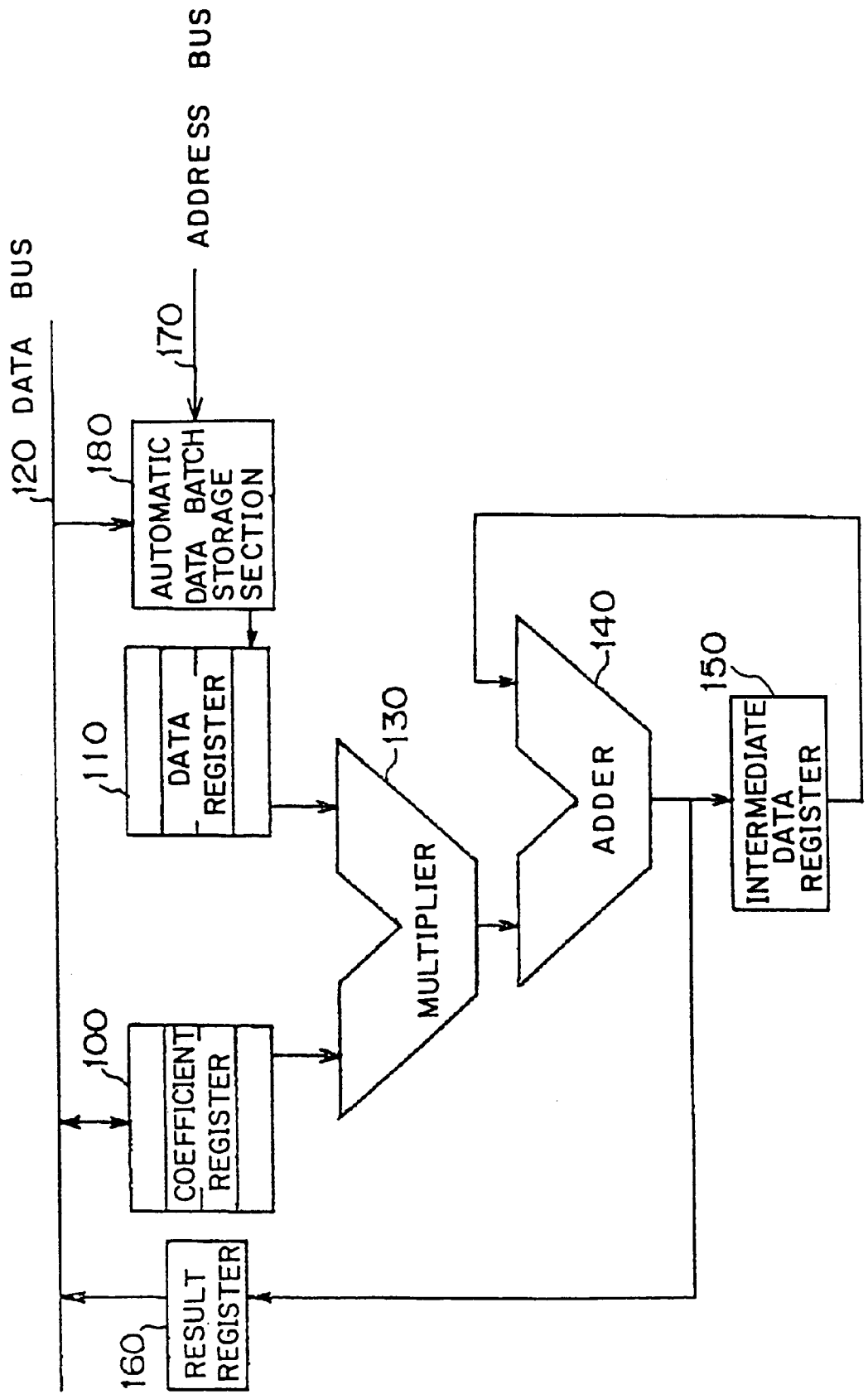
FIG. 2 is a block diagram of a sum-of-products arithmetic unit according to a first embodiment of the present invention.

FIG. 2 is a block diagram of a sum-of-products arithmetic unit according to a first embodiment of the present invention, which further comprises an automatic data batch storage section 180 in addition to the above arrangement. The section initially accepts only one address in data register 110 from the external CPU not shown over address bus 170 and then automatically specifies the storage locations for input data in data register 110 in sequence. That is, by initially accepting address data from the external CPU only once, the arithmetic unit is allowed to perform a process of writing input data sent over data bus 120 into data register 110 in sequence and a process of reading data from the data register in sequence for a sum-of-products arithmetic.

Figure 3:
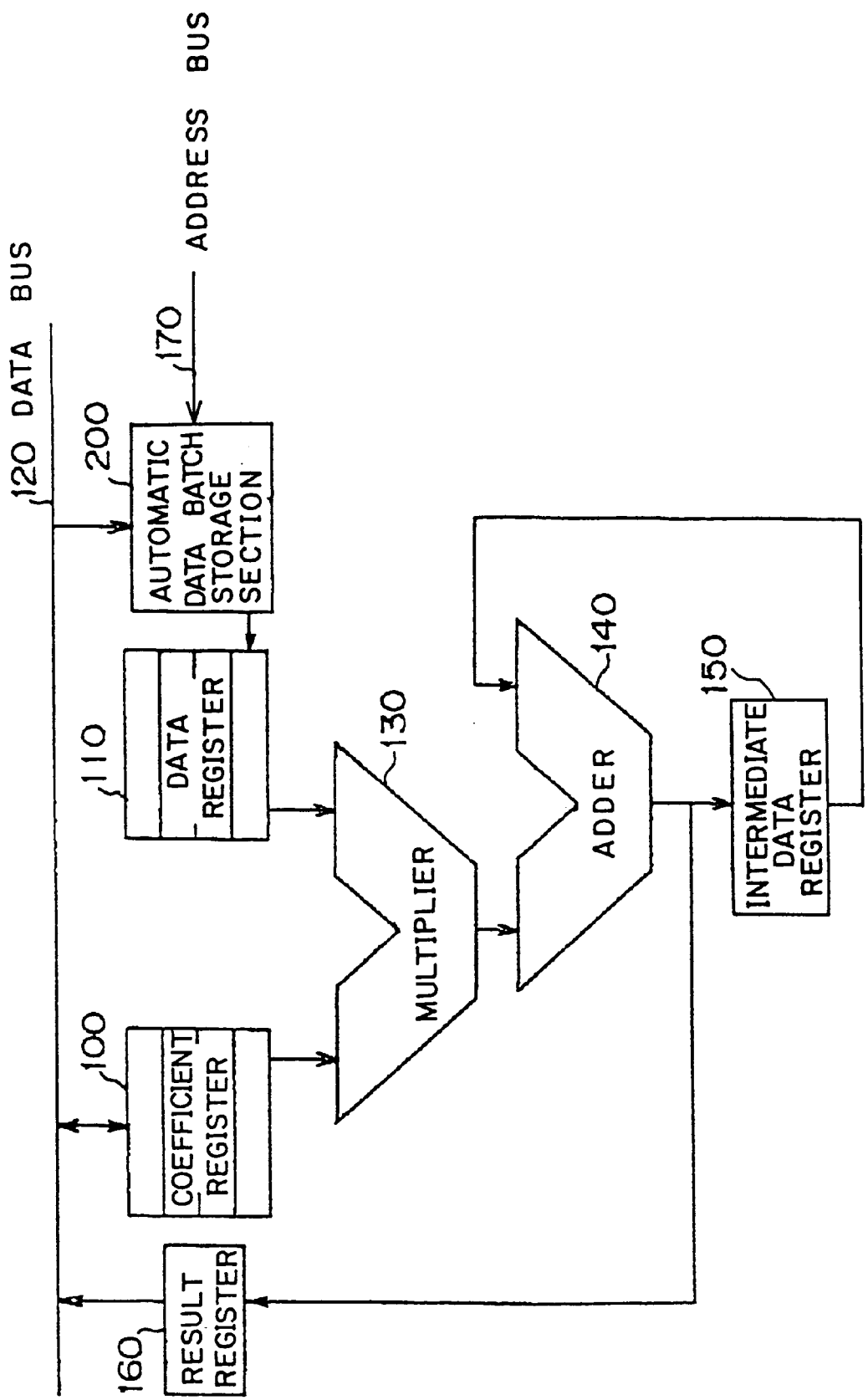
FIG. 3 is a block diagram of a sum-of-products arithmetic unit according to a second embodiment of the present invention.

FIG. 3 is a block diagram of a sum-of-products arithmetic unit according to a second embodiment of the present invention. This arithmetic unit has an automatic address setting section 200 in place of automatic data batch storage section 180 in the first embodiment.

The address setting section initially accepts an address in data register 110 from the external CPU over address bus 170, and thereafter accepts the same address (hereinafter referred to as a dummy address) over address bus 170, thereby automatically specifying storage locations for input data in data register 110 and writing in and reading out the input data.

In the prior art shown in FIG. 1, each time a piece of data is to be stored in data register 110, an address specified by the external CPU is decoded so that a real address is obtained. However, the automatic address setting section 200 can automatically specify storage locations in data register 110 simply by receiving the dummy address each time a piece of input data is entered. This will eliminate the need for the CPU to store address data for each storage location in data register 110.

Figure 4:
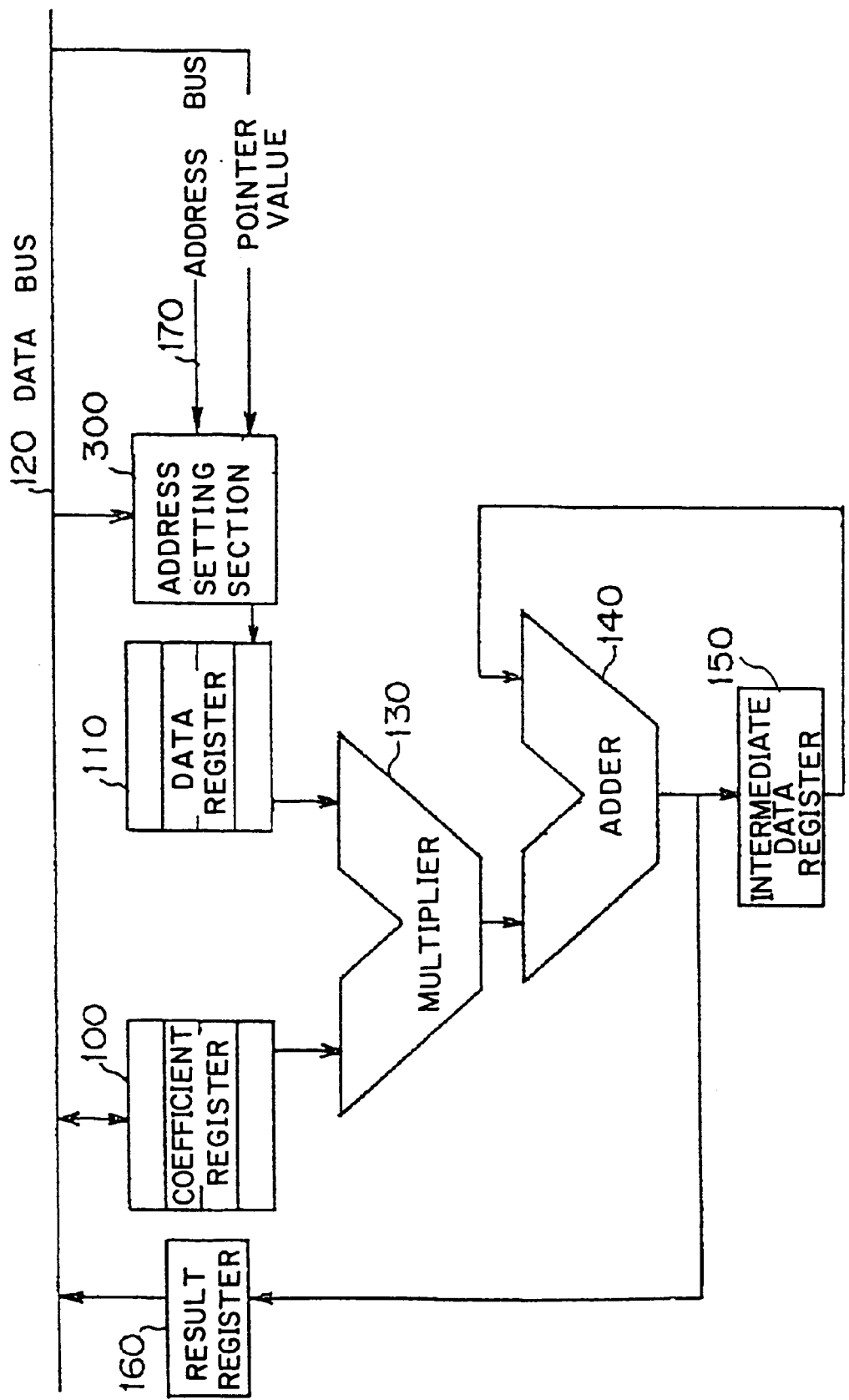
FIG. 4 is a block diagram of a sum-of-products arithmetic unit according to a third embodiment of the present invention.

FIG. 4 is a block diagram of a sum-of-products arithmetic unit according to a third embodiment of the present invention, which is equipped with an address setting section 300 in place of automatic data batch storage section 180 in the first embodiment.

This address setting section is adapted to specify storage locations in data register 110 simply by receiving a piece of address data from the external CPU over address bus 170 and receiving a pointer value over data bus 120 each time input data is entered. This eliminates the prior need of inputting address data over address bus 170 each time a piece of input data is entered.

Figure 5:
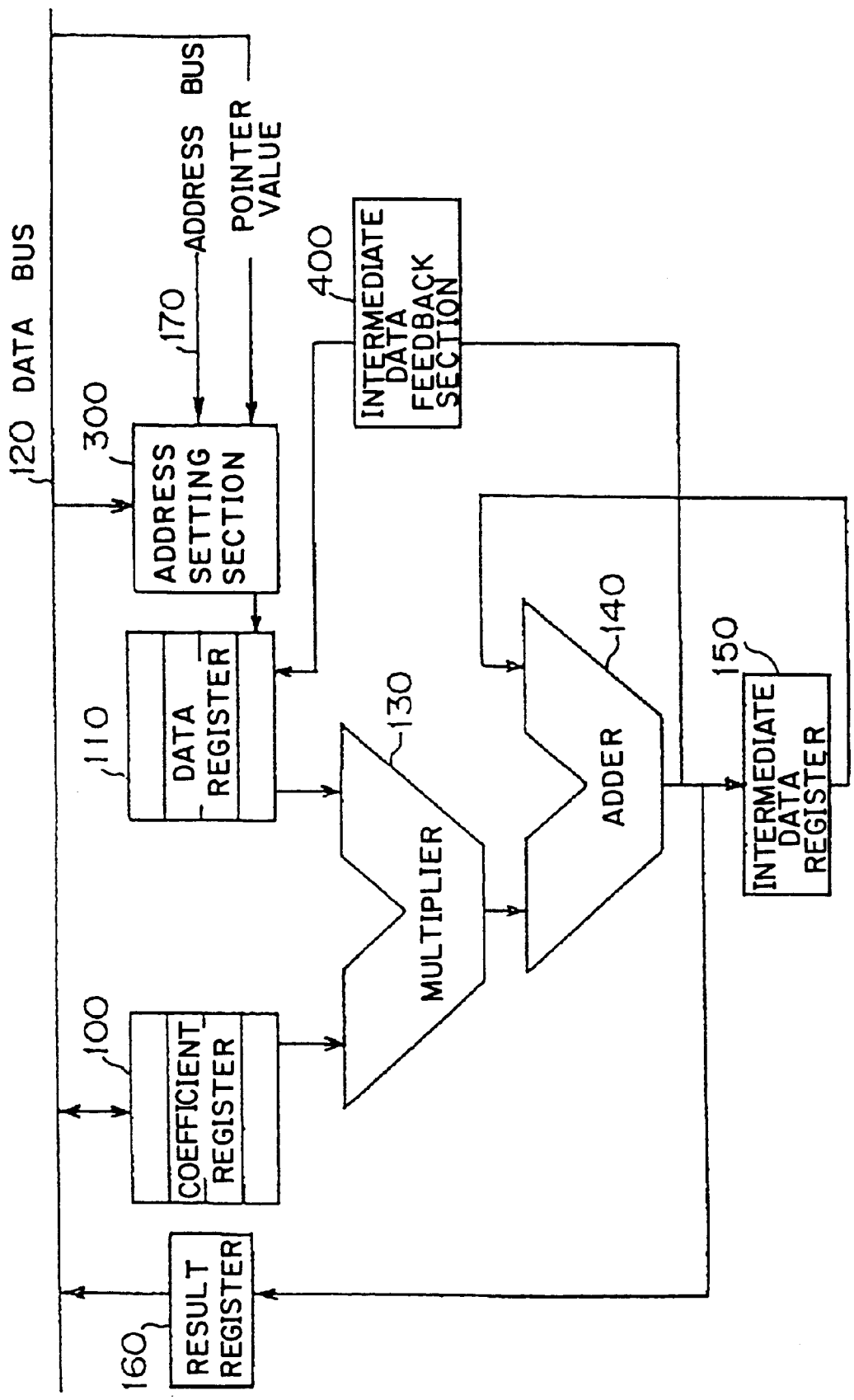
FIG. 5 is a block diagram of a sum-of-products arithmetic unit according to a fourth embodiment of the present invention.

FIG. 5 is a block diagram of a sum-of-products arithmetic unit according to a fourth embodiment of the present invention, which is equipped with an intermediate data feedback section 400 in addition to the arrangement of the third embodiment. The intermediate data feedback section 400 permits partially completed results of a sum-of-products arithmetic by multiplier 130 and adder 140 to be returned to data register 110 without the use of data bus 120.

It thus becomes possible to store readily partially completed results in data register 110 and to perform sum-of-products arithmetic again, which is required to configure a recursive filter such as an IIR filter. In this case, an address in data register 110 to store the partially completed results is specified by address setting section 300 which is identical to that in the third embodiment.

Address setting section 300 in the fourth embodiment can be replaced by automatic data batch storage section 180 in the first embodiment or automatic address setting section 200 in the second embodiment.

Figure 6:
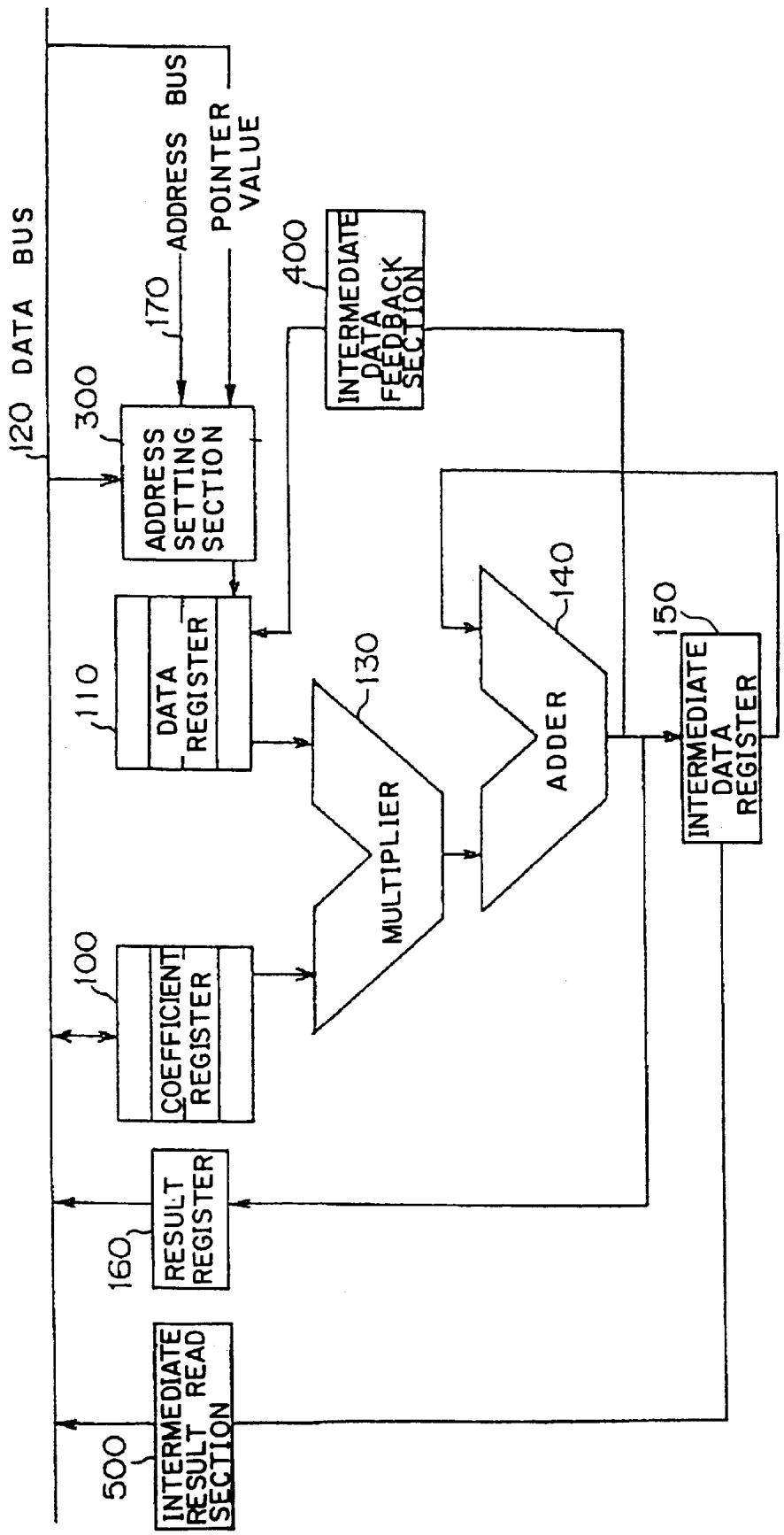
FIG. 6 is a block diagram of a sum-of-products arithmetic unit according to a fifth embodiment of the present invention.

FIG. 6 is a block diagram of a sum-of-products arithmetic unit according to a fifth embodiment of the present invention, in which an intermediate data read section 500 is added to the arrangement of the fourth embodiment. The intermediate data read section 500 outputs intermediate results of a sum-of-products arithmetic by multiplier 130 and adder 140 on data bus 120. This allows the CPU not shown to read partially completed results of sum-of-products arithmetic through data bus 120.

Address setting section 300 in the fifth embodiment can be replaced by automatic data batch storage section 180 in the first embodiment or automatic address setting section 200 in the second embodiment.

Figure 7:
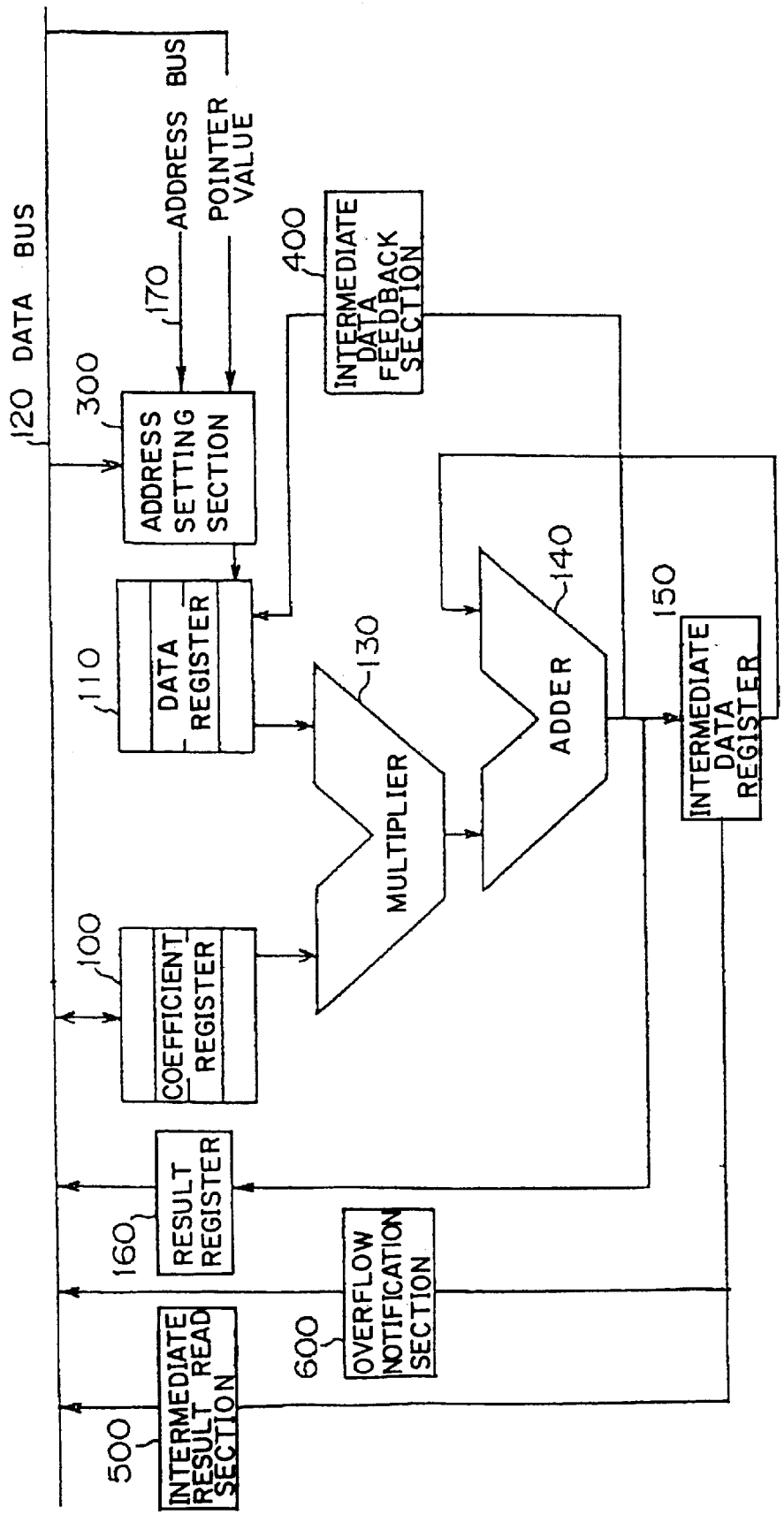
FIG. 7 is a block diagram of a sum-of-products arithmetic unit according to a sixth embodiment of the present invention.

FIG. 7 is a block diagram of a sum-of-products arithmetic unit according to a sixth embodiment of the present invention, in which an overflow notification section 600 is added to the arrangement of the fifth embodiment. If an overflow occurs in the middle of a sum-of-products arithmetic, the overflow notification section 600 stores the number of that term in a sum of products which is in the process of being operated on the occurrence of the overflow and notifies the external CPU of the occurrence of the overflow.

Address setting section 300 in the sixth embodiment can be replaced by automatic data batch storage section 180 in the first embodiment or automatic address setting section 200 in the second embodiment.

The operation of the first to sixth embodiments shown in FIGS. 2 to 7 will be described hereinafter.

First, the operation of the first embodiment will be described.

Coefficients are stored in coefficient register 100 and input data is stored in data register 110 prior to sum-of-products arithmetic operation. To store data in data register 110, the external CPU first sends an address in data register 110 to automatic data batch storage section 180 over address bus 170 and then transfers input data to automatic data batch storage section 180 over data bus 120.

If the input address matches some address in data register 110, then automatic data batch storage section 180 specifies the starting real address in data register 110 and then loads input data into that starting address. When no address match occurs, the input address is ignored.

The starting address in data register 110 is specified on input of the first address. After that, successive pieces of input data sent over data bus 120 are stored in successive addresses in data register 110.

With the first embodiment, the CPU simply performs data register addressing once. In comparison with the prior art, advantages of the first embodiment are that less time is required for data transfer and addressing, and arithmetic operation of a sum of products can be performed more simply and faster.

Coefficient data is sent from the CPU to coefficient register 100 over the data bus. The coefficient data need not be rewritten so frequently as input data. As with the prior art, therefore, it is possible to address the coefficient register by the CPU and write coefficient data into that register through the data bus. As is the case with data register 110, coefficient register 100 may be connected to automatic data batch storage section 180. In this case, the coefficient register will be addressed in the same manner as the data register.

After coefficient register 100 and data register 110 have been loaded with coefficients and input data, multiplier 130 and adder 140 perform arithmetic operation of sum of products. In this case, data used first for arithmetic is fed into multiplier 130. A coefficient in coefficient register 100 serves as the other input of multiplier 130. The multiplier calculates the product of the input data and the coefficient and then sends the result to adder 140. At first the input value at the other input of adder 140 is set to 0. The output of adder 140 is stored in intermediate data register 150 and the output of that register is applied to the other input of adder 140. Thereby, the addition of the intermediate result data and the next product of input data and coefficient data is repeated to thereby perform arithmetic operation of a sum of products. The result of the arithmetic operation is stored in result storage register 160, which can be read out by the CPU.

Next, the operation of the second embodiment shown in FIG. 3 will be described. The second embodiment differs in arrangement from the first embodiment in that, in place of automatic data batch storage section 180 in the first embodiment, automatic address setting section 200 is provided for addressing storage locations in data register 110. In other respects the second embodiment remains unchanged from the first embodiment.

In the first embodiment, when first input data is loaded into data register 110, an address in the data register is entered into automatic data batch storage section 180 only once. In contrast, in the second embodiment, an address in data register 110 is entered into automatic address setting section 200 from the CPU not shown over address bus 170 each time a piece of data is input into data register 110. In this case, addresses to be entered into the address setting section need not be individual addresses of storage locations in data register 110; the trailing addresses may be the same as the first address to be input to the address setting section. It is necessary only that the first address be any address in data register 110. The addresses are dummy addresses which is described above.

If the input addresses matches an address in data register 110, then address setting section 200 will specify, first of all, the starting real address, and then remaining real addresses in sequence, so that input data sent over data bus 120 is stored in each successive location in the data register. If no match exists between addresses entered into the address setting section and any address in data register 110, then they will be ignored.

Therefore, the second embodiment, unlike the prior art, eliminates the need for storing addresses used to write into data register 110, achieving a reduction in the area of memory. In addition, there is no need of decoding each of input addresses, except the first address, thus speeding up processing.

The operation of the third embodiment shown in FIG. 4 will be described next.

The third embodiment remains unchanged from the first and second embodiments, except the way data register 110 is addressed by address setting section 300.

In the third embodiment, the CPU initially transfers the starting address in data register 110 in which first data is to be stored to address setting section 300 over address bus 170. The CPU also sends a pointer value for data register 110 and a piece of input data to address setting section 300 over data bus 120. That is, data entry is such that pointer value 0 and input data are input first, pointer value 1 and input data are input next, and so on.

Address setting section 300 obtains the starting real address in data register 110 from that starting address, specifies a storage address for input data on the basis of that starting real address and the corresponding pointer value, and stores the input data in that storage address in the data register.

Unlike the first and second embodiments, the third embodiment cannot automatically generate pointers for data register 110. However, since, at the time of data transfer, it is required only that the CPU specify one address and pointer values, less CPU storage area is required for the address and pointer values. In the third embodiment, therefore, the hardware cost will be lowered in comparison with the first and second embodiments.

Next, the operation of the fourth embodiment shown in FIG. 5 will be described.

The fourth embodiment differs from the third embodiment in that intermediate data feedback section 400 is added. The data register addressing is the same as that in the third embodiment. Input data and a coefficient are stored in data register 110 and coefficient register 100 in the same manner as above, so that arithmetic operation of a sum of products is initiated.

The product of the first data in data register 110 and the first coefficient in coefficient register 100 is calculated by multiplier 130, and then entered into adder 140. At first, the other input value of adder 140 is set to 0, so that the sum of that product and 0 is computed. The sum is stored in intermediate data register 150. In this manner the first sum of products is computed. When this sum is loaded into intermediate data register 150, the next coefficient and the next data are read from the respective registers and then multiplied in multiplier 130. The resulting product and the sum previously loaded into intermediate data register 150 are added in adder 140 and the resulting sum is loaded into register 150. This processing is repeated until the result of a sum of products is obtained.

In the fourth embodiment, intermediate data feedback section 400 returns the output of adder 140, i.e., the intermediate data of a sum of products, to data register 110 as instructed by the CPU not shown. The intermediate data is stored in that address in data register 110 which is specified by the CPU. This permits a recursive sum-of-products operation. The fourth embodiment is adapted for configuring IIR filters.

The fifth embodiment shown in FIG. 6 further comprises intermediate data read section 500 in addition to the arrangement of the fourth embodiment. The intermediate data read section 500 outputs the intermediate result of sum of products output from adder 140 onto data bus 120 as instructed by the CPU and transfers it to the CPU.

The intermediate data read section 500 can thus read out the intermediate data at any time as requested by the CPU.

The sixth embodiment shown in FIG. 7 further comprises overflow notification section 600 in addition to the arrangement of the fifth embodiment. Thus, the data writing into data register 110 and the sum-of-products processing are each performed in the same way as the fifth embodiment.

In sum-of-products arithmetic, there is a limit on the number of bits that multiplier 130 and adder 140 can handle. During sum-of-products arithmetic, the number of bits may overflow. In the prior art, even if an overflow occurs, the processing only continues as it is. Overflow notification section 600 in the sixth embodiment makes a decision as to whether an overflow has occurred each time intermediate data is obtained by multiplier 130 and adder 140. If an overflow has occurred, overflow notification section 600 outputs the term number of intermediate data that caused overflow onto data bus 120 in order to indicate how many terms (corresponding in number to products) had been processed until the overflow occurred.

By knowing the number of terms involved in the intermediate result, the CPU can perform readily debug processing to correct coefficients, etc., in such a way that no overflow will occur.

Figure 8:
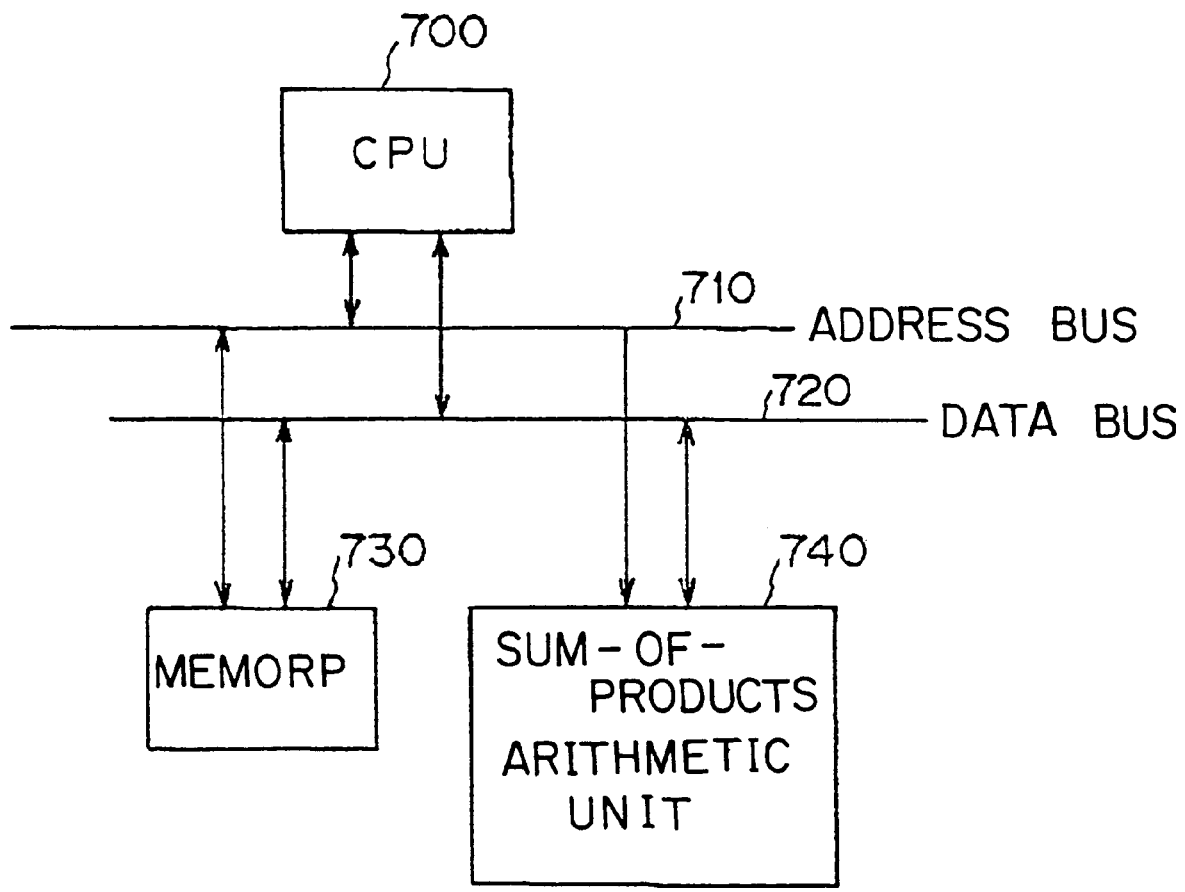
FIG. 8 shows a system configuration of the present invention.

FIG. 8 shows a system configuration for use with the above-described sum-of-products arithmetic circuits.

A CPU 700, which corresponds to the CPU not shown in the description of the first to sixth embodiments, is connected to an address bus 710 and a data bus 720. A memory 730 and a sum-of-products arithmetic circuit 740 are connected to address bus 710 and data bus 730.

In memory 730 are stored control software for CPU 700 and input data, coefficients, address data and pointer values for arithmetic circuit 740. Arithmetic circuit 740 is implemented by one of the above-described sum-of-products arithmetic circuits.

Note that the present invention is not necessarily limited to the use of the system configuration of FIG. 8. For example, a sequencer-equipped DSP (Digital Signal Processor) may be used in place of the CPU.

Hereinafter, specific examples of the first to sixth embodiments will be described. Each of these embodiments includes coefficient register 100 which stores coefficient data for multiple terms, data register 110 which stores input data for multiple terms, multiplier 130 and adder 140 which perform sum-of-products arithmetic, intermediate data register 150 which stores intermediate data obtained in the middle of the sum-of-products arithmetic, and result register 160 which stores the final result of the arithmetic.

Coefficient register 100 and data register 110 have their respective outputs connected to each of two inputs of multiplier 130. The coefficient register is connected to data bus 120 as well so that it can be written with and/or read of coefficient data by CPU 700 that is shown in FIG. 8 but not shown in FIG. 9. The output of multiplier 130 is connected to an input of adder 140 having its other input connected to the output of intermediate data register 150. The output of adder 140 is connected to the inputs of intermediate data register 150 and result register 160. The result register is connected to data bus 120 so that it can be read of the result of sum-of-products arithmetic by CPU 700.

Figure 9:
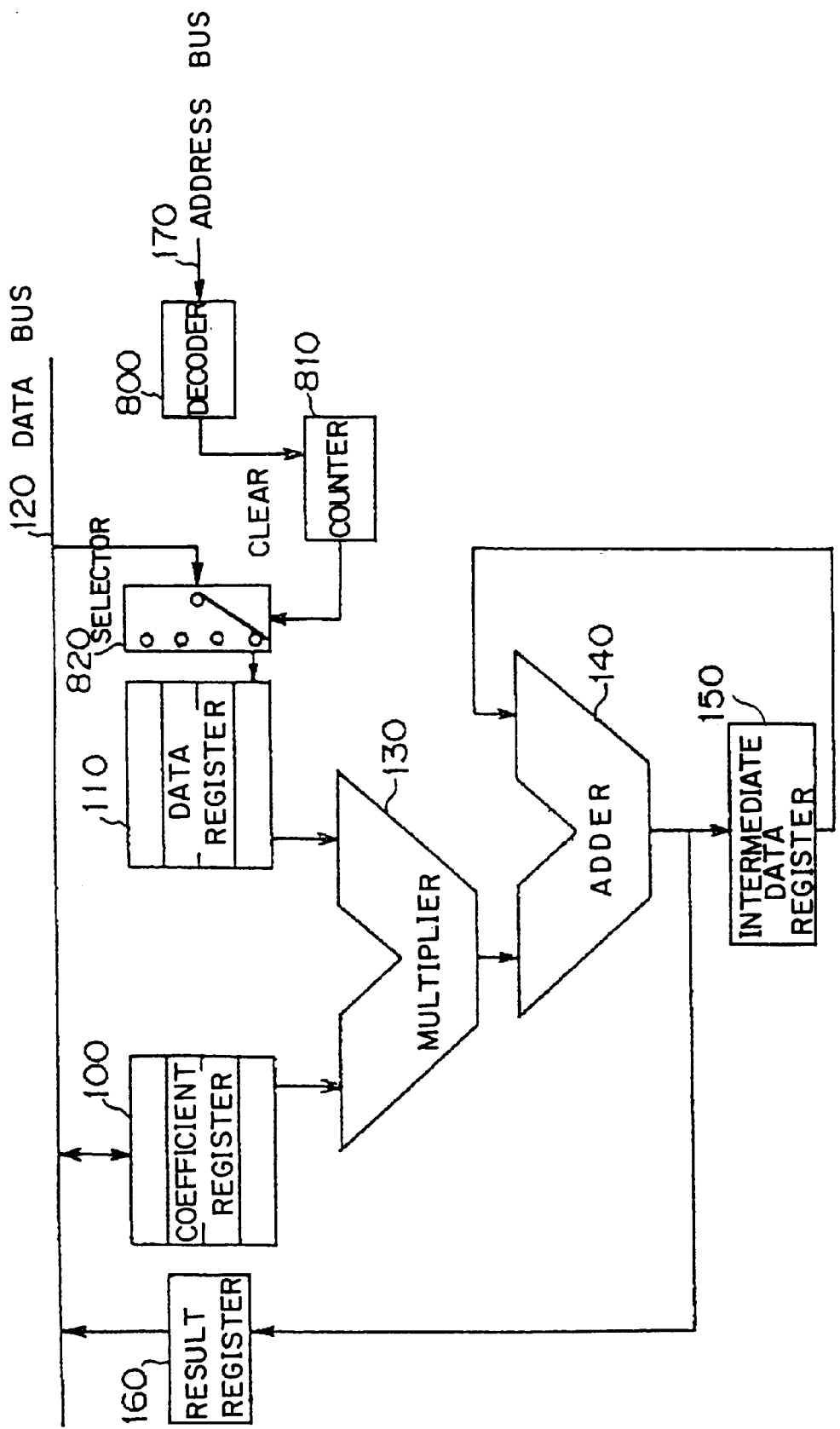
FIG. 9 is a more-detailed block diagram of the sum-of-products arithmetic unit of FIG. 2.

FIG. 9 shows a specific example of the sum-of-products arithmetic circuit according to the first embodiment. Automatic data batch storage section 180 of FIG. 2 comprises a decoder 800, a counter 810, and a selector 820. Decoder 800 is connected to address bus 170 and counter 810. The counter is connected to decoder 800 and selector 820. The selector is connected to counter 810, data bus 120, and data register 110.

Address data is entered into decoder 800 over address bus 170 under the control of CPU 700. The decoder decodes input address data. That is, the decoder makes a decision as to whether an input address matches some address in data register 110 and ignores it if no match exists. If, on the other hand, a match is found, then the decoder 800 will clear counter 810 to zero.

Counter 810 is adapted to count terms corresponding in number to storage locations in data register 110. In the exemplary system shown, data register 110 accommodates input data for four terms; thus, the counter is adapted to count from 0 to 3. Needless to say, the counter will count from 0 to 7 for 8-term sum-of-products arithmetic and similarly count from 0 to 31 for 32-term sum-of-products arithmetic. The counter may be implemented by a cyclic counter circuit.

Upon receipt of a clear signal from decoder 800, counter 810 is reset to zero. That is, when an address in data register 110 is sent to decoder 800 over address bus 170 by CPU 700, counter 810 is reset to zero.

A count output of the counter 810 is applied to selector 820 as a select signal. That is, when the count in counter 810 is 0, input data sent over data bus 120 is stored in the starting address in data register 110 via selector 820 and, when the count is 1, input data is stored in the second storage location in data register 110. Upon each completion of data storage in data register 110, the counter is incremented automatically.

In the first embodiment, CPU 700 simply transfers address data and input data to arithmetic circuit 740 only at first data storage time and thereafter transfers only data to arithmetic circuit 740 over data bus 120. In addition, decoder 800, which makes a decision as to whether input address matches some address in data register 110 and outputs a clear signal to counter 810 if the address match occurs, can be made simple in construction.

Thus, the first embodiment permits input data to be loaded into data register 110 in sequence by first specifying an address in data register 110 once. That is, CPU 700 can automatically load multiple pieces of input data into data register 110 on a batch basis.

In addition, the first embodiment is suitable for reading data for sum-of-products arithmetic. That is, by specifying an address in data register 110 once at the start of arithmetic to read out stored data and place multiplier 130 and adder 140 in operation, each piece of data stored in data register 110 can automatically be read into multiplier 130 in sequence. In this case, counter 810 has only to be incremented whenever a single sum-of-products arithmetic operation is completed.

In the arrangement of FIG. 9, writing into and/or reading from coefficient register 100 is performed by CPU 700, but not automatically. The same type of circuitry for data register 110 may be added to coefficient register 100 for automatic writing in and/or reading out of coefficients.

Figure 10:
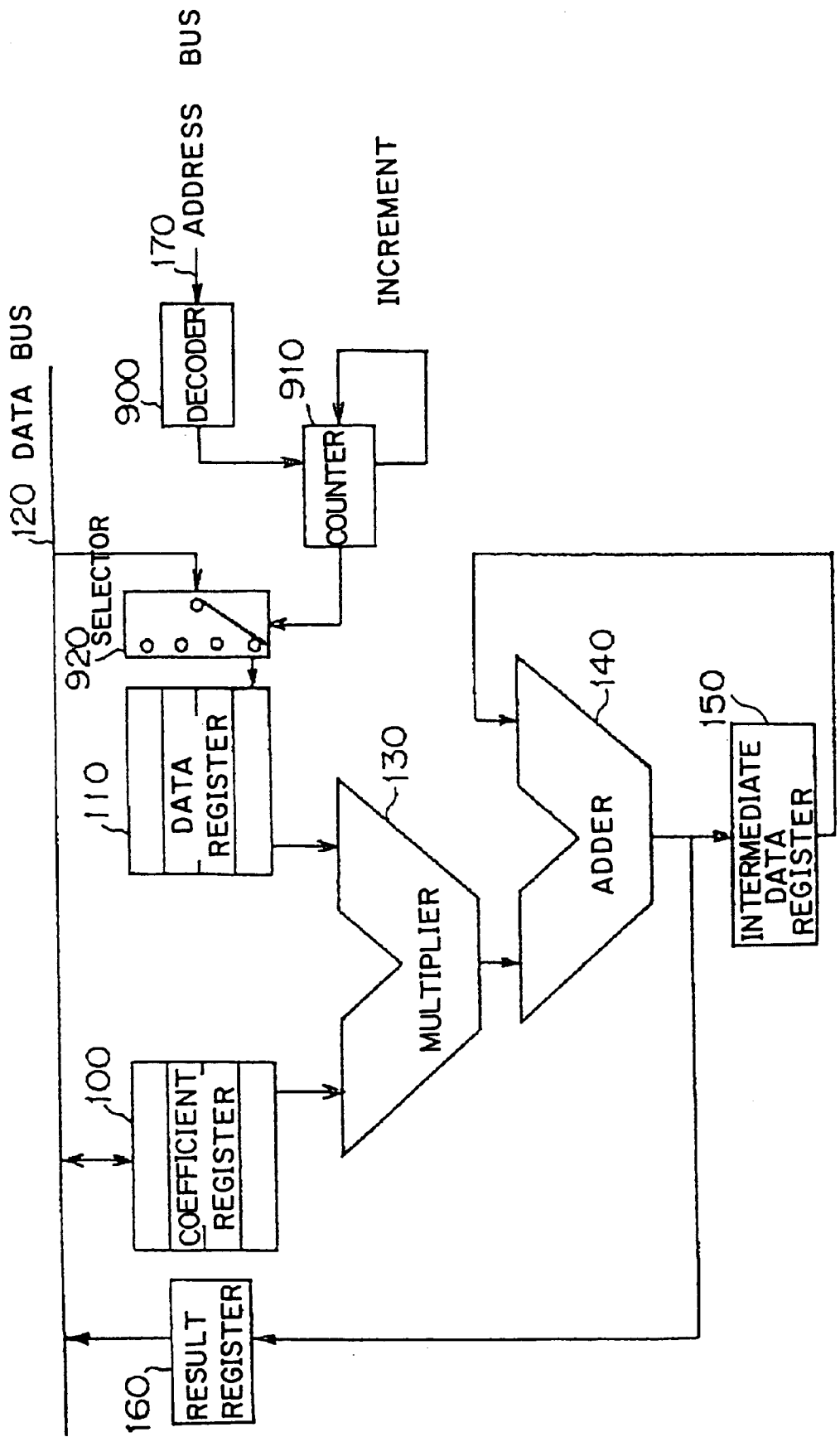
FIG. 10 is a more-detailed block diagram of the sum-of-products arithmetic unit of FIG. 3.

FIG. 10 shows a specific example of the arithmetic circuit according to the second embodiment.

Automatic address setting section 200 in the second embodiment, like the automatic data batch storage section in the first embodiment, comprises a decoder 900, a counter 910, and a selector 920. Decoder 900 is connected to address bus 170 and counter 910, counter 910 is connected to decoder 900 and selector 920, and selector 920 is connected to data bus 120, counter 910, and data register 110, these connections being the same as those in the first embodiment.

The second embodiment differs from the first embodiment in that CPU 700 always provides address data and input data in pairs. Address data is entered into decoder 900 over address bus 170 and input data is entered into selector 920 over data bus 120. However, since there is no need of obtaining a real address in data register 110 from address data, any address that indicates data register 110 may be used as address data.

Decoder 900 decodes an address sent over address bus 170 to decide whether or not that address matches an address indicating data register 110. If the address match occurs, then the decoder 900 provides a signal to increment counter 910. If, on the other hand, no address match occurs, then the address and data are ignored.

Counter 910 is incremented by an increment signal from decoder 900 and provides its count to selector 920 as a select signal. The counter is reset to zero at first address/data entry time.

Selector 920 loads input data sent over data bus 120 into a corresponding storage location in data register 110 in response to a select signal from counter 910.

Thus, the second embodiment permits only each piece of data for which an address in data register 110 is specified to be loaded into data register 110 in sequence. Although, in the prior art, it is required to decode each address sent over address bus 170 to obtain a real address in data register 110, the present embodiment is configured such that counter 910 is incremented to obtain the next storage location in data register 110 each time an address indicating data register 110 is entered. Thus, decoder 900 is only required to have a function of deciding whether or not an input address indicates data register 110.

Figure 11:
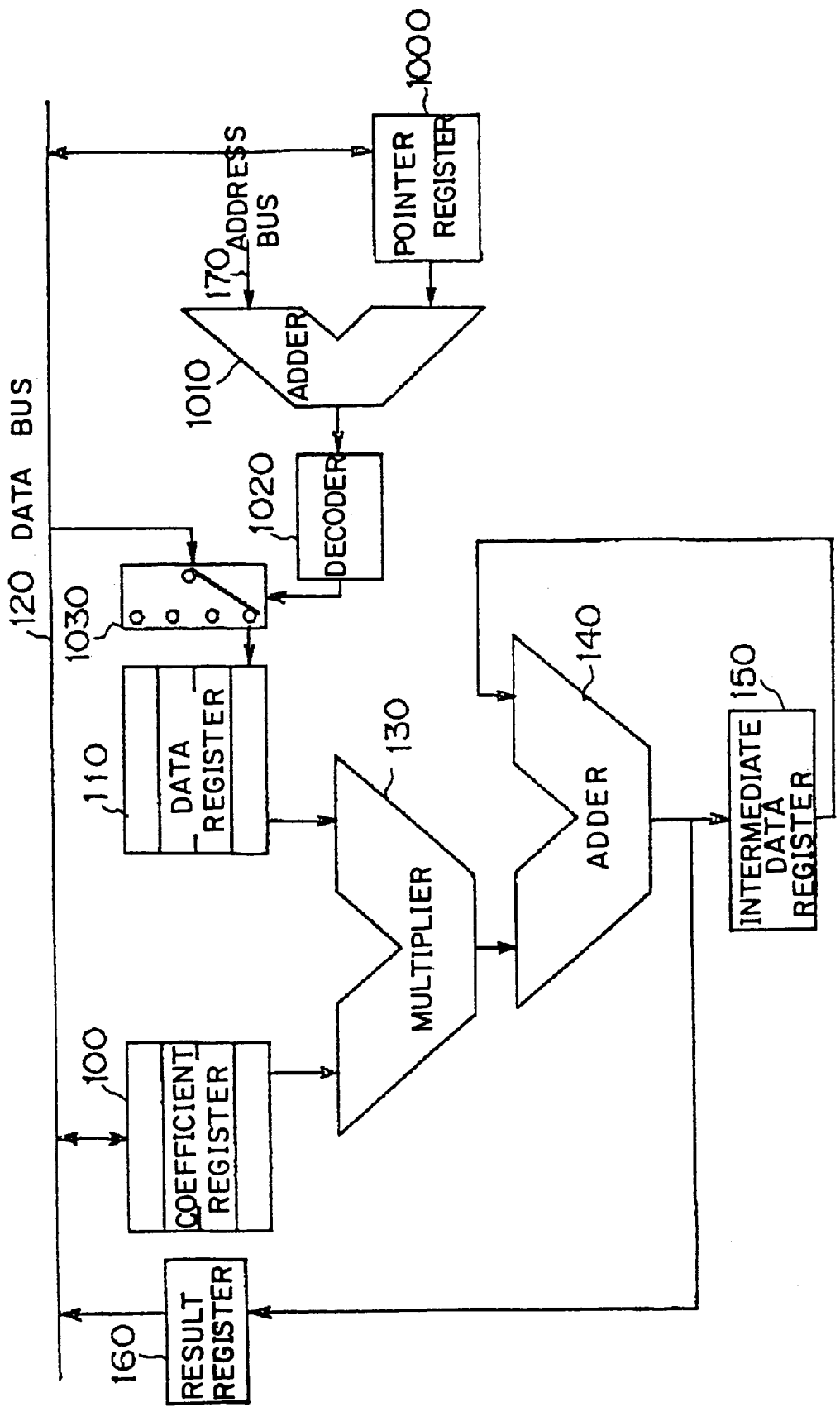
FIG. 11 is a more-detailed block diagram of the sum-of-products arithmetic unit of FIG. 4.

FIG. 11 shows a specific example of the arithmetic circuit according to the third embodiment.

Address setting section 300 in the third embodiment comprises a pointer register 1000, an adder 1010, a decoder 1020, and a selector 1030. Pointer register 1000 is connected to data bus 120 and an input of adder 1010, the other input of which is connected to address bus 170. The output of adder 1010 is connected to decoder 1020, the output of which is connected to selector 1030. The selector is connected to data bus 120, decoder 1020, and data register 110.

Unlike the first and second embodiments, the third embodiment is not arranged to automatically generate select signals (pointers) to select storage locations in data register 110. That is, CPU 700 specifies an address in data register 110 and a pointer value indicating a storage location in the data register each time data is to be loaded into the data register 110. The starting address in the data register 110 may be specified as that address. Alternatively, a dummy address indicating data register 110 may be specified.

An address is entered into adder 1010 via address bus 170, and a pointer is loaded into pointer register 1000 via data bus 120. Pointers take values from 0 to an integer (the number of storage locations in data register 110 minus one), and the pointer values are controlled by CPU 700.

An address and a pointer value from pointer register 1000 are added together in adder 1010. The output of adder 1010 is fed into decoder 1020 for address decoding. The output of decoder 1020 is applied to selector 1030 as a select signal. Input data sent to selector 1030 over data bus 120 is loaded into a storage location in data register 110 that is determined by the select signal from decoder 1020.

Thus, the present embodiment requires for CPU 700 to specify the starting address in data register 110 and a pointer value and hence largely depends on CPU 700 in comparison with the first and second embodiments. Unlike the prior art, however, CPU 700 is not required to store addresses of respective individual storage locations in data register 110 in its memory area. The CPU has only to store the starting address and pointer values in its memory area and specify them to the arithmetic circuit. In addition, unlike the first and second embodiments, CPU 700 can specify any desired storage location in data register 110 on the basis of the starting address and a pointer value.

The third embodiment may use a unit that increments a pointer automatically in place of pointer register 1000.

Figure 12:
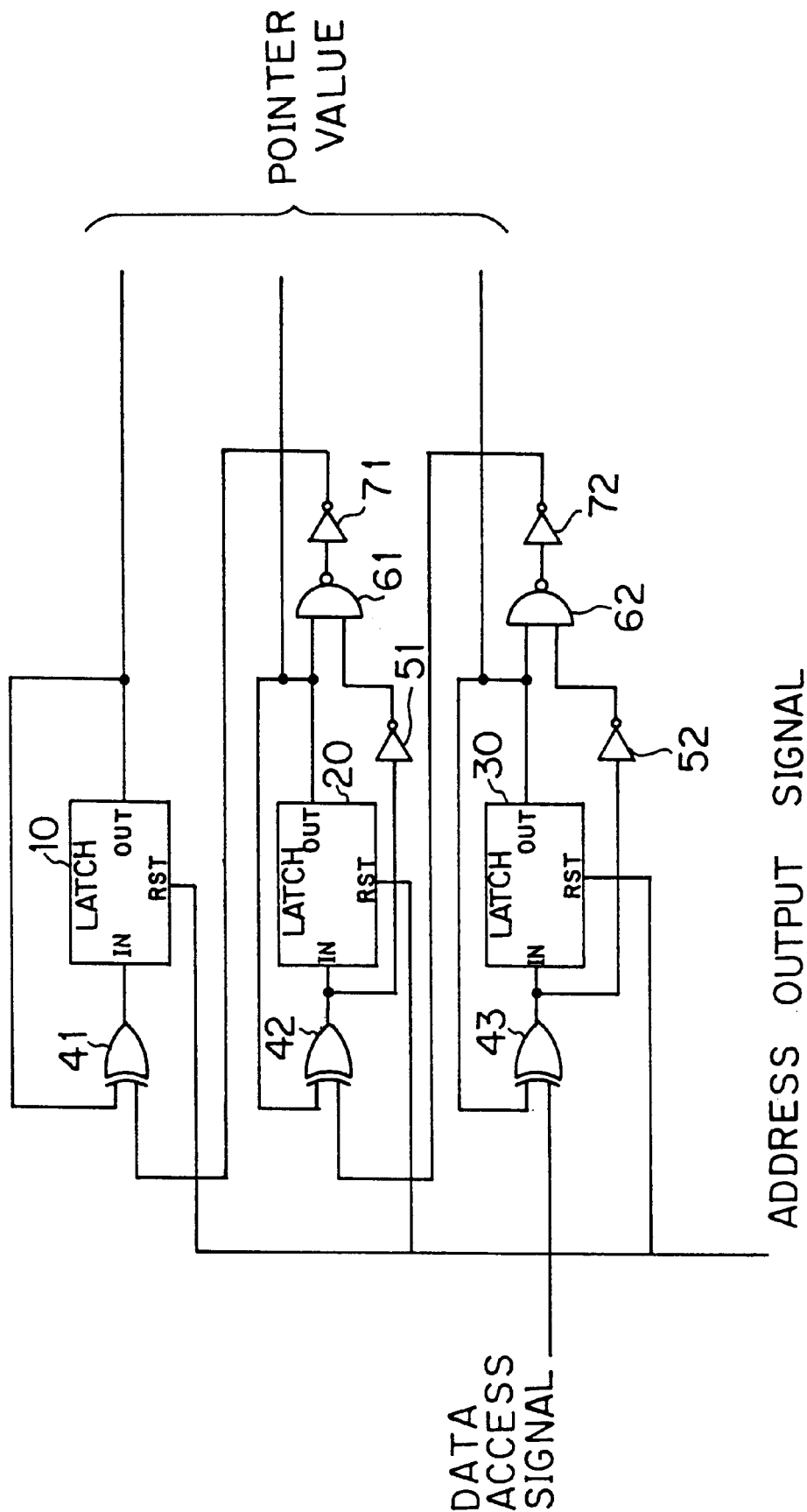
FIG. 12 shows an arrangement of such a unit.

FIG. 12 shows an arrangement of such a unit. In this figure, 10, 20 and 30 denote latch registers, each of which is reset to 0 when an address output signal applied to its RST terminal goes to a 1. As an example, the address output signal may be an output signal of decoder 800 shown in FIG. 9 which outputs a 1 when the external CPU addresses the data register.

Each of latches 10, 20 and 30 holds input data of one cycle before applied to its input (IN) at its output (OUT). The outputs of the respective latches are applied to adder 1010 as a pointer value. In this example, since three latches are used, a pointer will take a value represented by three bits.

An EX(Exclusive)-OR gate 43 has its input connected to the output of latch 30 and its other input connected to a data access signal, which is applied with each transfer of data from the external CPU. The output of EX-OR gate 43 is connected to the input of an inverter 52, the output of which is connected to an input of a NAND gate 62. The other input of NAND gate 62 is connected to the output of latch 30. The output of NAND gate 62 is connected to the input of an inverter 72 the output of which is connected to an input of an EX-OR gate 42. In this way, the output of the first stage in this unit, i.e., the output of inverter 72, is used as an input to the second stage, i.e., an input to EX-OR gate 42. Likewise, the output of the second stage, i.e., the output of an inverter 71 serves as an input to the third stage, i.e., an input to an EX-OR gate 41.

The unit thus arranged is cleared by an address output signal when the data register is addressed first by the CPU. After that, the pointer value will be incremented automatically by a data access signal with each transfer of data from the CPU.

The use of such a unit as increments the pointer value automatically eliminates the need for the CPU to specify a pointer value with each transfer of data. In addition, the storage area to store pointer values need not be reserved within the CPU.

The third embodiment can be practiced without adder 1010. In this case, an address is entered into selector 1030 after being decoded by decoder 1020 and a pointer value loaded into pointer register 1000 is entered into the selector 1030. By using both of the address, e.g., the starting address and the pointer value as a select signal, a storage location in data register 110 can be specified.

Figure 13:
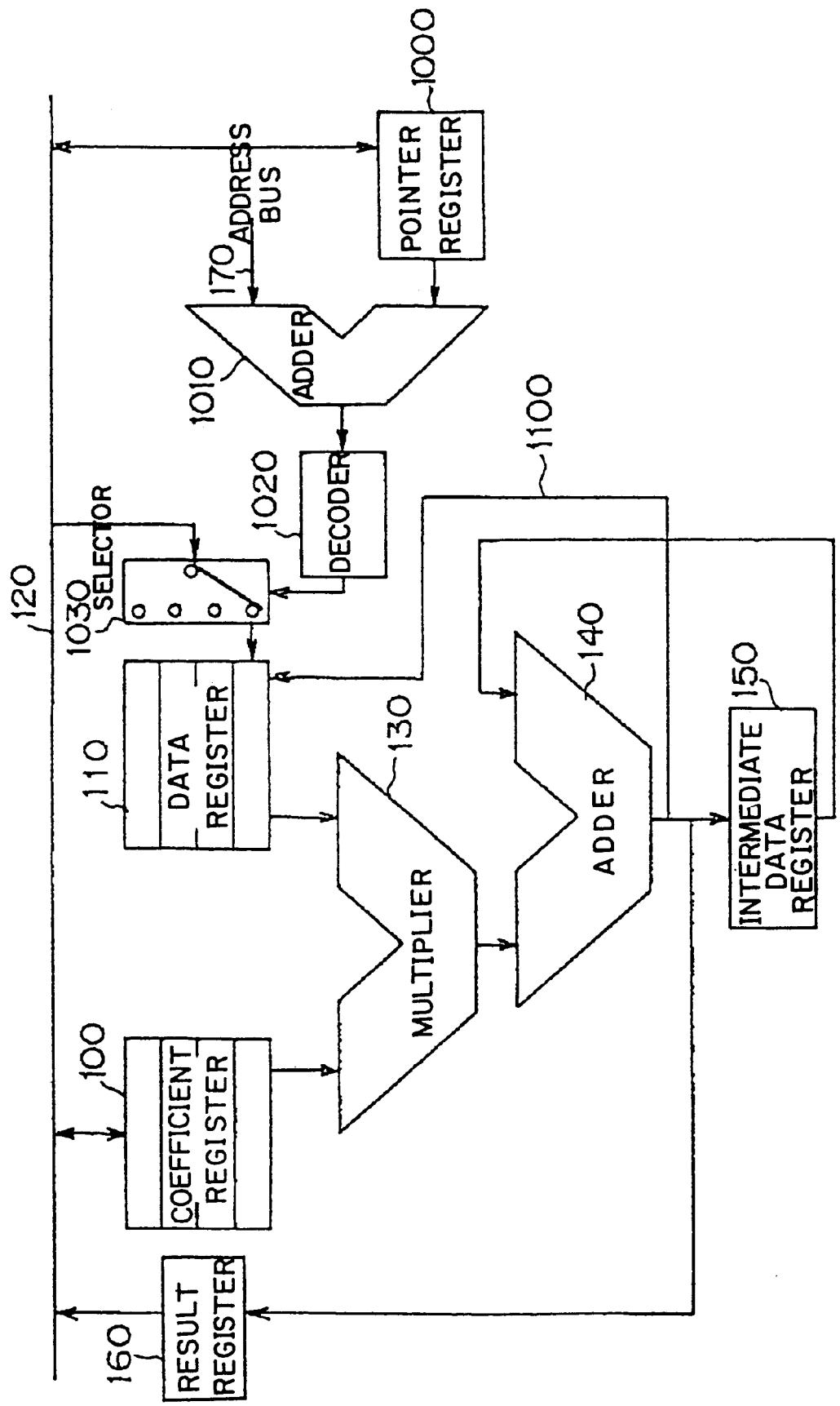
FIG. 13 is a more-detailed block diagram of the sum-of-products arithmetic unit of FIG. 5.

FIG. 13 shows a specific example of the fourth embodiment shown in FIG. 4, which is the same as the third embodiment, except for intermediate data feedback section 400.

In this example, the intermediate data feedback section 400 is implemented by a data line 1100 which feeds the output of adder 140 back to data register 110. Data register addressing may be directed by CPU 700, or the addressing method described in connection with the third embodiment shown in FIG. 11 may be used.

By returning the output of adder 140 to data register 110 in this manner, sum-of-products arithmetic can be performed recursively using partially completed results of the arithmetic, allowing an IIR filter to be implemented.

Figure 14:
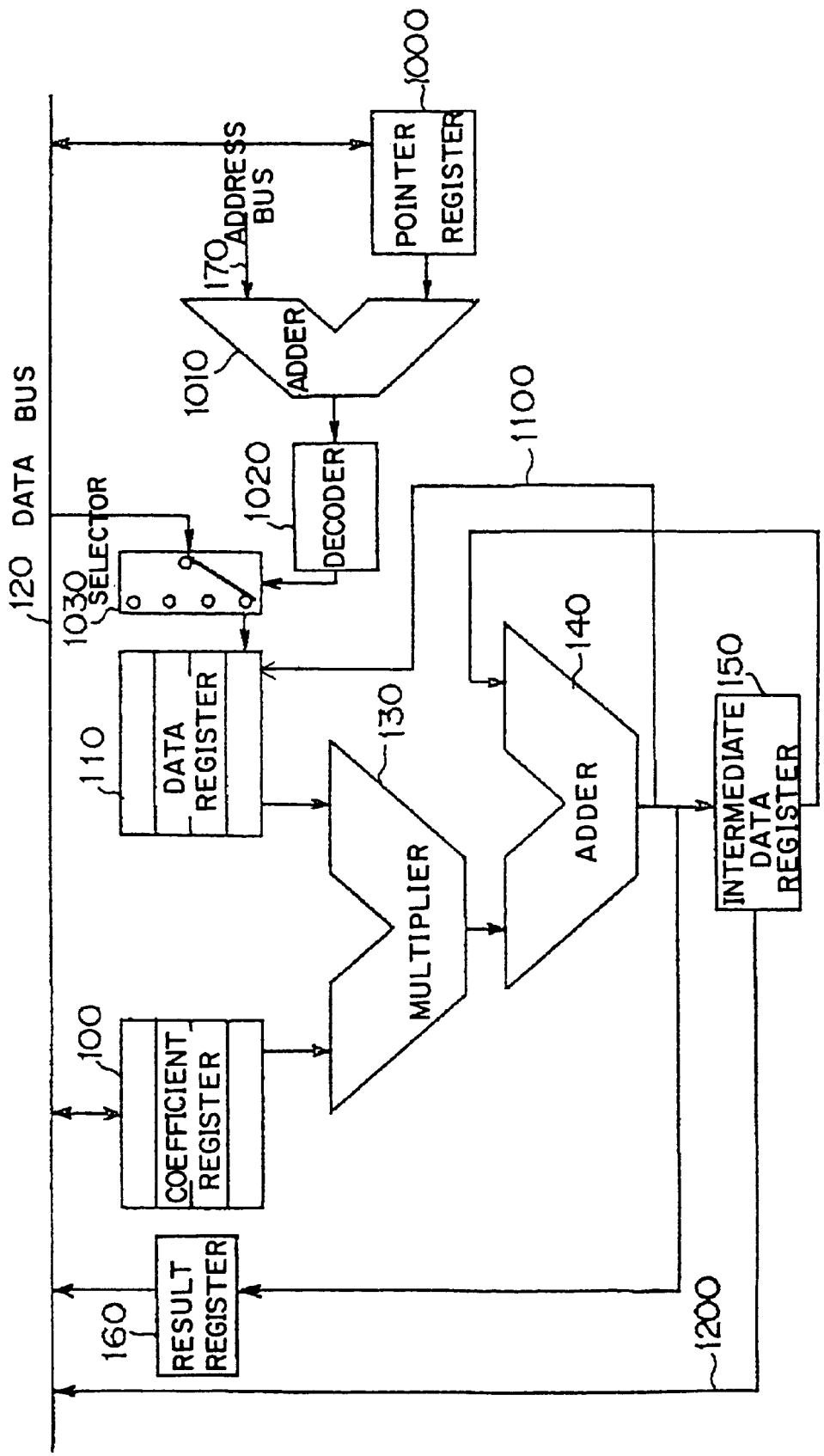
FIG. 14 is a more-detailed block diagram of the sum-of-products arithmetic unit of FIG. 6.

FIG. 14 shows a specific example of the fifth embodiment shown in FIG. 6, which is the same as the fourth embodiment, except for intermediate data readout section 500.

The intermediate data readout section 500 can be implemented by a data line 1200 that connects the output of intermediate data register 150 to data bus 120. Partially completed results of sum-of-products arithmetic which are stored in intermediate data register 150 are read out onto the data bus as instructed by CPU 700.

The read data can be used for processing by CPU 700 or can be stored into data register 110 again. In writing into data register 110, it can be addressed in the manner described in connection with the third embodiment using pointer register 1000, adder 1010, decoder 1020, and selector 1030. Alternatively, the data register may be addressed by incrementing the counter automatically as in the first embodiment. If intermediate data is loaded into the data register in sequence in this manner, sum-of-products arithmetic can be performed again.

Figure 15:
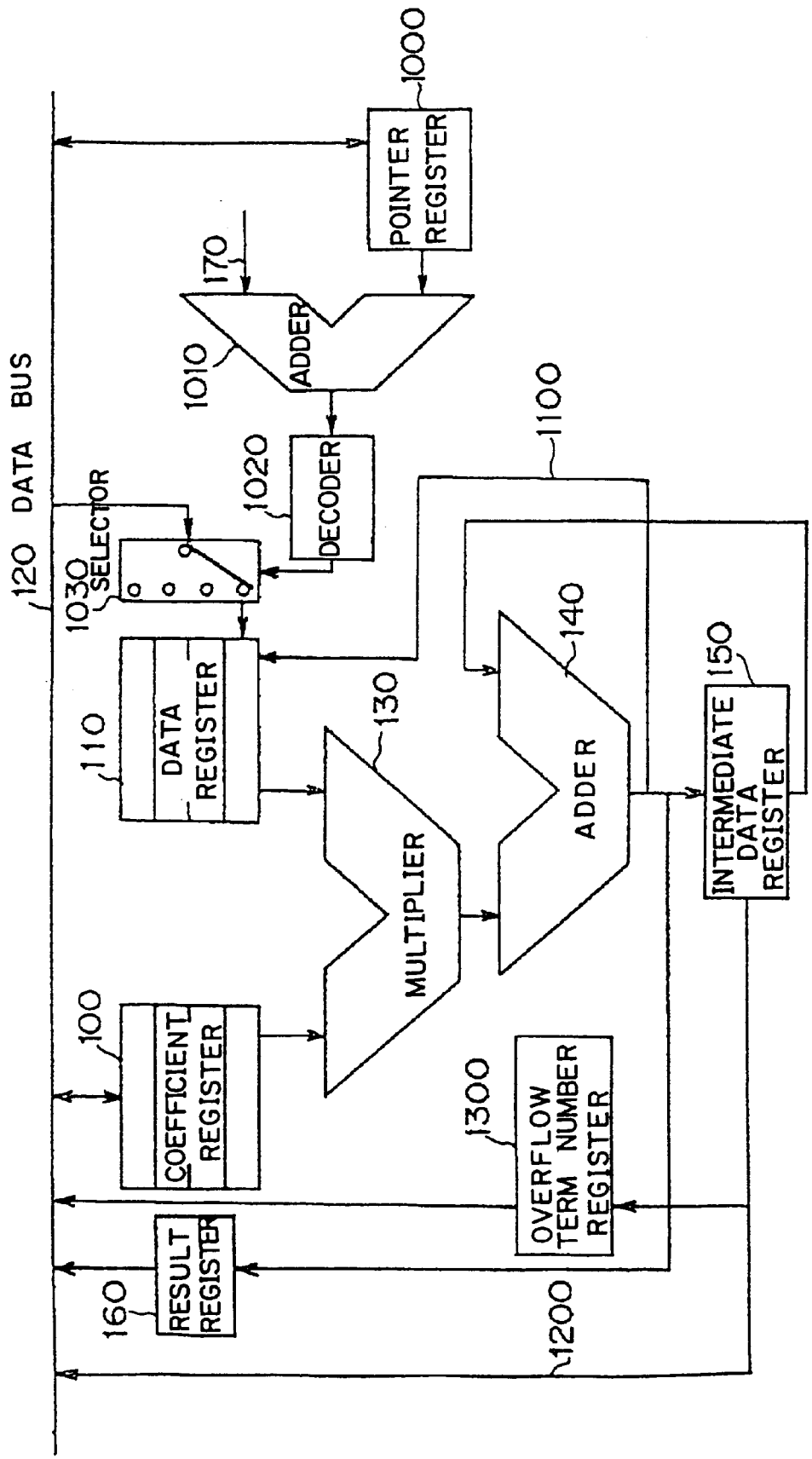
FIG. 15 is a more-detailed block diagram of the sum-of-products arithmetic unit of FIG. 7.

FIG. 15 shows a specific example of the sixth embodiment shown in FIG. 7, which is the same as the fifth embodiment, except for overflow notification section 600.

The overflow notification section 600 is implemented by an overflow term number register 1300 having its input connected to intermediate data register 150 and its output connected to data bus 120.

When an overflow occurs while sum-of-products arithmetic is being performed, register 1300 stores the number of terms which have been processed before the occurrence of the overflow. By reading the number of terms stored in register 1300 or intermediate data which has caused overflow from intermediate data register 150 over data line 1200, it becomes easy to perform debug processing to alter coefficient data so that no overflow will occur.

Figure 16:
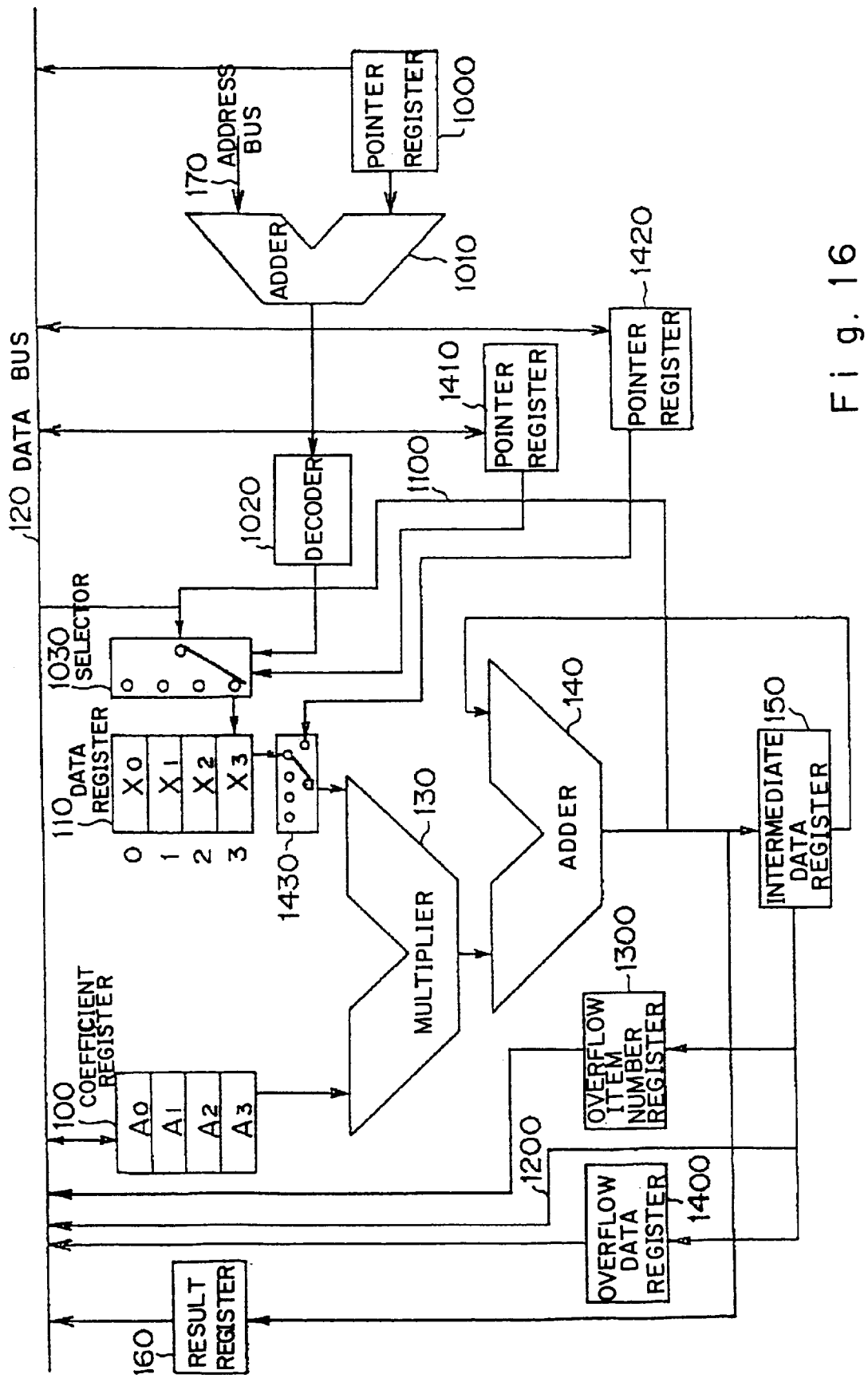
FIG. 16 is a more-detailed block diagram of the sum-of-products arithmetic unit of FIG. 14.

FIG. 16 shows a more-detailed configuration of the sixth embodiment (shown in FIG. 7 and FIG. 15).

This figure is assumed to perform four-term sum-of-products arithmetic. Thus, coefficient register 100 will accommodate coefficient data (A0, A1, A2, A3) for four terms and data register 110 will accommodate input data (X0, X1, X2, X3) for four terms. Note that any number of terms is permitted if it is not less than two.

This arithmetic unit includes, in addition to the arrangement of FIG. 15, an overflow data register 1400, connected between intermediate data register 150 and data bus 120, which stores data that has caused overflow, pointer registers 1410 and 1420 which store pointers sent from CPU 700 over data bus 120, and a selector 1430 which is connected to receive output data of data register 110 as its input data and pointers from pointer register 1420 as its select signal. The pointers stored in pointer register 1410 are used a select signal for selector 1030.

Now, the sum-of-products arithmetic procedure will be described in sequence on the assumption that coefficient data (A0, A1, A2, A3) has been stored in coefficient register 100 and input data (X0, X1, X2, X3) has been stored in data register 110.

In this arithmetic unit, multiplier 130 performs arithmetic operation of multiplication of coefficient data x input data for each term, and adder 140 adds each product in sequence. That is, $A0 \times X0 + A1 \times X1 + A2 \times X2 + A3 \times X3$ will be computed.

If, when coefficient data and input data are each eight bits long, the output line of adder 140 is 8+8+2 (2 is needed for addition of four terms) bits wide, i.e., 18 bits wide, then the sum-of-products arithmetic will never cause overflow. However, if the result of the arithmetic is set to eight bits in width, then overflow will be considered to occur. Thus, the sum-of-products arithmetic circuit requires measures against overflow.

In this example, it is assumed that Q6 fixed-point arithmetic is performed. That is, arithmetic data takes the format that comprises one sign bit, a 1-bit integer part, and a 6-bit fraction.

Suppose now that A0=A1=A2=A3=1 (decimal number)= 40H (hexadecimal representation of Q6 fixed-point representation; 0100 0000 in binary notation), and X0=X1=X2=X3=40H. Then, the first product will be A0×X0=1000H (0001 0000 0000 0000 in binary representation). This corresponds to 40H in 8-bit Q6 fixed-point representation. Next, A1×X1=1000H is added to A0×X0=1000H to yield 2000H. This will become 80H in 8-bit Q6 fixed-point representation, indicating overflow in 8-bit Q6 fixed-point data. That is, Q6 fixed-point data can take only values from 80H (1000 0000 in binary number; −2 in decimal number) to 7FH (0111 1111 in binary number; 1.984375 in decimal number).

In the present embodiment, the sum-of-products arithmetic is continued by placing intermediate data, i.e., 80H, that caused overflow in overflow data register 1400 and a value of two, indicating that overflow has occurred on the second term of the arithmetic, in overflow term number register 1300. That is, A0×X0+A1×X1+A2×X2+A3×X3 is computed to completion regardless of overflow and 4000H is then stored in result register 160. The result is output on data bus 120 over data line 1200, thus terminating processing. If, at this point, 8-bit Q6 fixed-point data is specified as output data, then 00H will be stored in result register 160.

Consider the case where the sum-of-products arithmetic is performed in succession. In order to compute A0×X1+A1×X2+A2×X3+A3×X4 where X4 is new input data, it is required to store X4 in that storage location in data register 100 which has been stored with X0.

In this case, CPU 700 loads the value 0 into pointer register 1000, provides the input data X4 to selector 1030, and specifies the dummy address (address indicating data register 110) to adder 1010, so that X4 is stored in the X0 storage location.

Prior to the initiation of sum-of-products arithmetic, CPU 700 changes the value in pointer register 1420 from 0 to 1. Thus, the value of the select signal for selector 1430 is increased by one, so that the starting read address in data register 110 is increased by one. As a result, input data X1 is read first.

Thus, pointer register 1420 produces a signal to change the starting address for reading in data register 110.

Further, consider the case where the result of sum-of-products arithmetic or intermediate data is stored in data register 110 for the next sum-of-products arithmetic.

To store the result of sum-of-products arithmetic in data register 110, CPU 700 returns the data in result register 160 to selector 1030 over data bus 120 and places a value into pointer register 1410. This determines a storage location in data register 110 for the result of the arithmetic, thus permitting the result to be stored in the data register.

To return the intermediate data to data register 110, CPU 700 has only to return the intermediate data to selector 1030 over data line 1100. A storage location for the intermediate data in data register 110 is determined by placing a pointer value into pointer register 1410.

The provision of pointer register 1410 allows an IIR filter to be configured readily.

Figure 17:
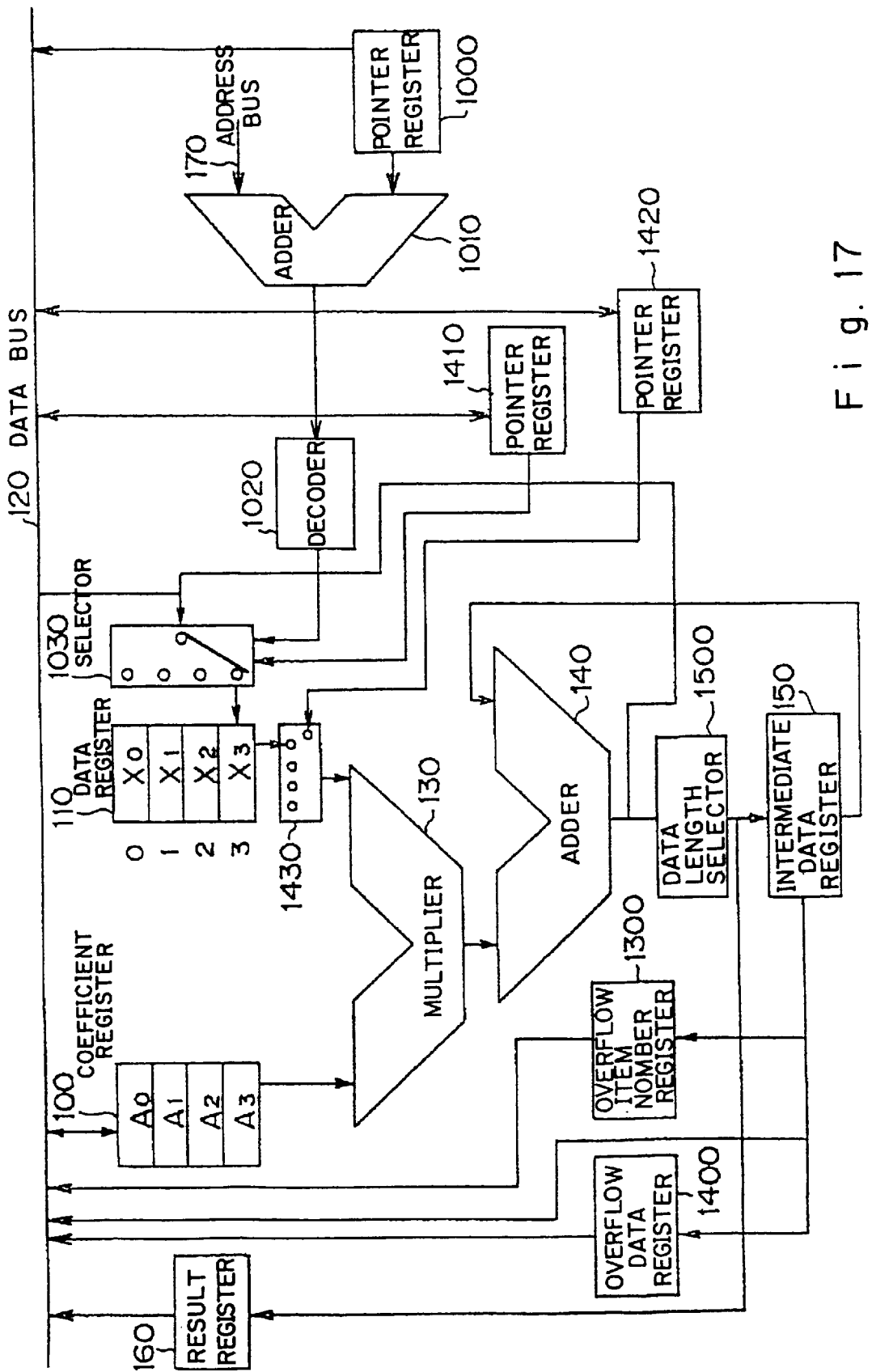
FIG. 17 shows a modification of the sum-of-products arithmetic unit of FIG. 15 which permits data length of the result of a sum-of-products operation to be selected.

Referring to FIG. 17, a data length selector 1500 is added to the arrangement of FIG. 16, which is connected between adder 140 and intermediate data register 150. The data length selector is adapted to select some bits from the result of sum-of-products arithmetic. For example, it allows eight bits to be selected from 16 bits, 16 bits to be selected from 32 bits, or eight bits to be output as they are.

Figure 18:
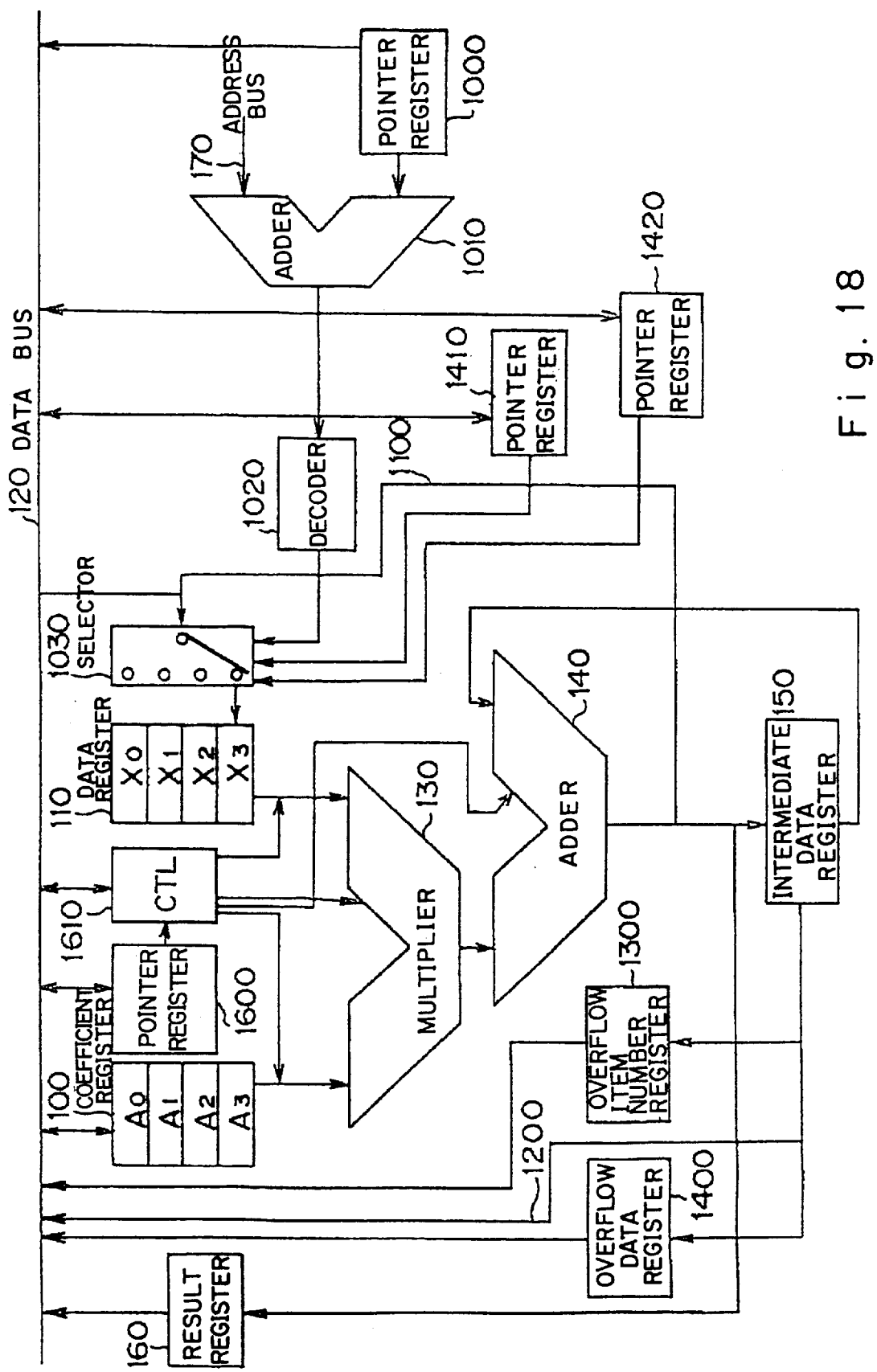
FIG. 18 shows a modification of the sum-of-products arithmetic unit of FIG. 15 which permits sum-of-products arithmetic to be suspended.

Finally, FIG. 18 shows an arrangement in which a pointer register 1600 and a controller (CTL) 1610 are added to the arrangement of FIG. 16. Pointer register 1600 is connected to data bus 120 and controller 1610, and controller 1610 is connected to data bus 120, data register 110, coefficient register 100, multiplier 130, and adder 140.

Pointer register 1600 and controller 1610 are used in the case where the execution of sum-of-products arithmetic is stopped at some term and the subsequent arithmetic cannot be executed unless data is transferred from some other processing unit not shown. In pointer register 1600 is stored a pointer value indicating the address of a term at which the execution of the sum-of-products arithmetic is stopped.

Controller 1610 stops the sum-of-products arithmetic when an address to data being read from data register 110 to multiplier 130 matches the address indicated by pointer register 1600. The controller waits for the transfer of necessary data over data bus 120. When the data is loaded into data register 110 or coefficient register 100, the controller controls multiplier 130 and adder 140 to resume the sum-of-products arithmetic from where it stopped.

According to the sum-of-products arithmetic units of the present invention, FIR filters with a wide variety of characteristics can be configured by selecting suitably coefficient data to be stored in the coefficient register. In addition, a wide variety of IIR filters can be configured by loading the results of sum-of-products arithmetic into the data register as input data.

For example, by using data corresponding to signals transmitted through delay elements as input data, non-recursive delay filters (transversal filters) or recursive delay filters can be configured.

According to the present invention, the first and second embodiments can generate addresses in the data register in which sum-of-products arithmetic data is to be stored within the arithmetic unit, thus eliminating the prior need of transferring address data from external storage to the arithmetic unit. This reduces transfer time and address generation time and speeds up processing. The third embodiment allows arithmetic data to be loaded into the data register at any time. The fourth embodiment is adapted to return partially completed results of sum-of-products arithmetic to the data register, thereby implementing recursive sum-of-products arithmetic without transfers of data over the data bus and reducing data transfer time. The fifth embodiment is adapted to output partially completed results of sum-of-products arithmetic on the data bus, allowing external processing of intermediate data to be performed readily. The sixth embodiment is adapted to make notification that overflow has occurred in the middle of sum-of-products arithmetic, which increases the debug efficiency of correcting coefficients.

According to the present invention, as described above, sum-of-products arithmetic units can be implemented which are adapted for IIR filters as well as FIR filters and permit fast address generation and data transfer.

What is claimed is:

1. A sum-of-products arithmetic unit comprising:
    register means for storing more than one piece of sum-of-products arithmetic data which is transferred in sequence from a unit external to said arithmetic unit; and
    automatic data batch storage means for, at the time of transfer of said sum-of-products arithmetic data, automatically specifying storage locations in said register means in sequence after an address in said register means has been specified first by said unit external to said sum-of-products arithmetic unit and writing said sum-of-products arithmetic data into said register means.

2. The unit according to claim 1, wherein said unit external to said sum-of-products arithmetic unit comprises a CPU, and wherein said automatic data batch storage means comprises a decoder for decoding said address in said register means specified by said CPU, a counter, reset by an output of said decoder, for counting the number of pieces of said sum-of-products arithmetic data being transferred, and a selector responsive to said counter for selecting each of said storage locations in said register means in sequence and storing each piece of said sum-of-products arithmetic data in said register means.

3. A sum-of-products arithmetic unit as recited in claim 1, further comprising:

control means for specifying an arbitrary address in said register means, suspending arithmetic after arithmetic data stored in addresses in said register means that precede said address have been operated on, and resuming the arithmetic in response to an action to start the arithmetic.

4. The arithmetic unit according to claim 3, wherein said action to start the arithmetic is writing arithmetic data into said register means after the suspension of arithmetic.

5. A sum-of-products arithmetic unit comprising:

register means for storing more than one piece of sum-of-products arithmetic data which is transferred in sequence from a unit external to said arithmetic unit; and automatic address setting means for, at the time of transfer of said sum-of-products arithmetic data, automatically specifying storage locations in said register means in sequence when an address specified by said unit external to said sum-of-products arithmetic unit matches an address in said register means and writing said sum-of-products arithmetic data into said register means.

6. The unit according to claim 5, wherein said unit external to said sum-of-products arithmetic unit comprises a CPU, and wherein said automatic address setting means comprises a decoder for decoding said address specified by said CPU, a counter for counting the number of pieces of said sum-of-products arithmetic data being transferred when it is found as the result of decoding by said decoder that said address specified by said CPU matches an address in said register means, and a selector responsive to said counter for selecting each of said storage locations in said register means in sequence and storing each piece of said sum-of-products arithmetic data in said register means.

7. A sum-of-products arithmetic unit comprising:

register means for storing more than one piece of sum-of-products arithmetic data which is transferred in sequence from a unit external to said arithmetic unit; and address setting means for, at the time of transfer of said sum-of-products arithmetic data, specifying storage locations in said register means in sequence in accordance with the sum of an address and each of pointer values specified by said unit external to said arithmetic unit and writing said sum-of-products arithmetic data into said register means.

8. The unit according to claim 7, wherein said unit external to said sum-of-products arithmetic unit comprises a CPU, and wherein said address setting means comprises an adder for adding said address and each pointer value specified by said CPU, a decoder for decoding an address in said register means obtained as an output of said adder, and a selector responsive to said decoder for selecting each of said storage locations in said register means in sequence and storing each piece of said sum-of-products arithmetic data in said register means.

9. A sum-of-products arithmetic unit comprising:

register means for storing more than one piece of sum-of-products arithmetic data which is transferred in sequence from a unit external to said arithmetic unit; and means for, at the time of transfer of said sum-of-products arithmetic data, automatically specifying storage locations in said register means in sequence in accordance with the sum of an address specified by said unit external to said arithmetic unit and a pointer value that is incremented automatically.

10. A sum-of-products arithmetic unit comprising:

register means for storing more than one piece of sum-of-products arithmetic data which is transferred in sequence from a unit external to said arithmetic unit; and intermediate data feedback means for automatically and directly transferring intermediate data of sum-of-products arithmetic to said register means as a piece of arithmetic data without using a data bus.

11. A sum-of-products arithmetic unit comprising:

register means for storing more than one piece of sum-of-products arithmetic data which is transferred in sequence from a unit external to said arithmetic unit;

intermediate data feedback means for automatically and directly transferring intermediate data of sum-of-products arithmetic to said register means as a piece of arithmetic data without using a data bus; and means for starting the next arithmetic when said intermediate data is transferred to said register means by said transfer means.

12. A sum-of-products arithmetic unit comprising:

a register for storing two or more pieces of data related to sum-of-products arithmetic;

an operations means for performing sum-of-products arithmetic based on the data stored in said registers;

intermediate data storage means for storing intermediate data of the sum-of-products arithmetic performed by said operations means; and intermediate data read means for outputting said intermediate data stored in said intermediate data storage means to a unit external to said sum-of-products arithmetic unit to check data when an overflow arises.

13. A sum-of-products arithmetic unit comprising:

arithmetic means for performing sum-of-products arithmetic; and overflow notification means for, when overflow occurs while the sum-of-products arithmetic operation is being performed, notifying an external unit of a term number which indicates at which term an overflow occurs in a sum-of-products of intermediate data during said sum-of-products arithmetic operation so that the sum-of-products arithmetic operation is continued.

14. A sum-of-products arithmetic unit comprising:

overflow term number storage means for, when overflow occurs while sum-of-products arithmetic is being performed, storing the number of a term in a sum of products at the time the overflow occurred; and overflow data storage means for storing intermediate data of the sum-of-products arithmetic at the time the overflow occurred during said sum-of-products arithmetic operation so that the sum-of-products arithmetic operation is continued.

15. The arithmetic unit according to claim 14, wherein an effective bit length is specified by a unit external to said sum-of-products arithmetic unit, and an overflow decision is made depending on whether said effective bit length is exceeded or not.

16. A digital filter for performing sum-of-products arithmetic comprising:

register means for storing more than one piece of sum-of-products arithmetic data which is transferred in sequence from a unit external to said arithmetic unit; and automatic data batch storage means for, at the time of transfer of said sum-of-products arithmetic data, automatically specifying storage locations in said register means in sequence by an address in said register means being specified just once and writing said sum-of-products arithmetic data into said register means.

17. A digital filter for performing sum-of-products arithmetic comprising:

register means for storing more than one piece of sum-of-products arithmetic data which is transferred in sequence from a unit external to said arithmetic unit; and automatic address setting means for, at the time of transfer of said sum-of-products arithmetic data, automatically specifying storage locations in said register means in sequence when an address specified externally matches an address in said register means and writing said sum-of-products arithmetic data into said register means.

18. A digital filter for performing sum-of-products arithmetic comprising:

register means for storing more than one piece of sum-of-products arithmetic data which is transferred in sequence from a unit external to said arithmetic unit; and automatic address setting means for, at the time of transfer of said sum-of-products arithmetic data, automatically specifying storage locations in said register means in sequence in accordance with the sum of an address and each of pointer values which are specified externally and writing said sum-of-products arithmetic data into said register means.

19. A method of specifying storage locations in a register in which more than one piece of data is stored comprising the steps of:

externally specifying an address in said register only once;

automatically specifying each of storage locations in said register in sequence; and writing data into said register.

20. A method of specifying storage locations in a register in which more than one piece of data is stored comprising the steps of:

externally specifying an address;

automatically specifying each of storage locations in said register in sequence when said externally specified address matches an address in said register; and writing arithmetic data into said register.

21. A method of specifying storage locations in a register in which more than one piece of data is stored comprising the steps of:

externally specifying an address and successive pointer values for said register;

automatically specifying a storage location in said register according to the sum of said address and each of said pointer values; and writing arithmetic data into said register.

* * * * *